United States Patent
Yu et al.

(10) Patent No.: US 10,133,094 B1
(45) Date of Patent: Nov. 20, 2018

(54) OPTOELECTRONIC DEVICE

(71) Applicant: ROCKLEY PHOTONICS LIMITED, London (GB)

(72) Inventors: Guomin Yu, Alhambra, CA (US);
Hooman Abediasl, Pasadena, CA (US);
Damiana Lerose, Pasadena, CA (US);
Amit Singh Nagra, Altadena, CA (US);
Pradeep Srinivasan, Fremont, CA (US); Haydn Frederick Jones, Reading (GB)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 15/700,053

(22) Filed: Sep. 8, 2017

Related U.S. Application Data

(60) Provisional application No. 62/528,900, filed on Jul. 5, 2017.

(30) Foreign Application Priority Data

Jul. 18, 2017 (GB) .................................. 1711525.4

(51) Int. Cl.
*G02F 1/01* (2006.01)
*G01J 1/04* (2006.01)
*H01L 21/78* (2006.01)
*H01L 27/30* (2006.01)

(52) U.S. Cl.
CPC ............ *G02F 1/011* (2013.01); *G01J 1/0425* (2013.01); *G02F 1/0102* (2013.01); *H01L 21/78* (2013.01); *H01L 27/30* (2013.01)

(58) Field of Classification Search
CPC ............ G02F 1/2257; G02F 2001/212; H01L 31/02327; H01L 31/03048; H01L 31/1105; H01L 31/0312
See application file for complete search history.

(56) References Cited

U.S. PATENT DOCUMENTS

| | | | |
|---|---|---|---|
| 4,093,345 | A | 6/1978 | Logan et al. |
| 4,720,468 | A | 1/1988 | Menigaux et al. |
| 4,943,133 | A | 7/1990 | Deri et al. |
| 5,438,444 | A | 8/1995 | Tayonaka et al. |
| 5,446,751 | A | 8/1995 | Wake |

(Continued)

FOREIGN PATENT DOCUMENTS

| | | |
|---|---|---|
| CN | 102162137 A | 8/2011 |
| EP | 0 310 058 A2 | 4/1989 |

(Continued)

OTHER PUBLICATIONS

Office Action issued in U.S. Appl. No. 14/629,922, dated Nov. 25, 2015, 13 pages.

(Continued)

*Primary Examiner* — Jack Dinh
(74) *Attorney, Agent, or Firm* — Lewis Roca Rothgerber Christie LLP

(57) ABSTRACT

An optoelectronic device and method of making the same. The device comprising: a substrate; a regrown cladding layer, on top of the substrate; and an optically active region, above the regrown cladding layer; wherein the regrown cladding layer has a refractive index which is less than a refractive index of the optically active region, such that an optical mode of the optoelectronic device is confined to the optically active region.

39 Claims, 16 Drawing Sheets

(56) References Cited

U.S. PATENT DOCUMENTS

| | | | |
|---|---|---|---|
| 5,511,088 A | 4/1996 | Loualiche et al. |
| 5,524,076 A | 6/1996 | Rolland et al. |
| 5,581,396 A | 12/1996 | Kubota et al. |
| 5,757,986 A | 5/1998 | Crampton et al. |
| 5,908,305 A | 6/1999 | Crampton et al. |
| 6,229,189 B1 | 5/2001 | Yap et al. |
| 6,298,177 B1 | 10/2001 | House |
| 6,349,106 B1 | 2/2002 | Coldren |
| 6,445,839 B1 | 9/2002 | Miller |
| 6,549,313 B1 | 4/2003 | Doerr et al. |
| 6,563,627 B2 | 5/2003 | Yoo |
| 6,580,739 B1 | 6/2003 | Coldren |
| 6,584,239 B1 | 6/2003 | Dawnay et al. |
| 6,614,819 B1 | 9/2003 | Fish et al. |
| 6,680,791 B2 | 1/2004 | Demir et al. |
| 6,710,911 B2 | 3/2004 | LoCascio et al. |
| 6,845,198 B2 | 1/2005 | Montgomery et al. |
| 6,873,763 B2 | 3/2005 | Nikonov |
| 7,085,443 B1 | 8/2006 | Gunn, III et al. |
| 7,092,609 B2 | 8/2006 | Yegnanarayanan et al. |
| 7,133,576 B2 | 11/2006 | Coldren et al. |
| 7,180,148 B2 | 2/2007 | Morse |
| 7,256,929 B1 | 8/2007 | Rong et al. |
| 7,394,948 B1 | 7/2008 | Zheng et al. |
| 7,570,844 B2 | 8/2009 | Handelman |
| 7,603,016 B1 | 10/2009 | Soref |
| 7,811,844 B2 | 10/2010 | Carothers et al. |
| 7,826,700 B2 | 11/2010 | Knights et al. |
| 7,941,014 B1 | 5/2011 | Watts et al. |
| 8,053,790 B2 | 11/2011 | Feng et al. |
| 8,093,080 B2 | 1/2012 | Liao et al. |
| 8,160,404 B2 | 4/2012 | Pan et al. |
| 8,242,432 B2 | 8/2012 | Feng et al. |
| 8,346,028 B2 | 1/2013 | Feng et al. |
| 8,401,385 B2 | 3/2013 | Spivey et al. |
| 8,403,571 B2 | 3/2013 | Walker |
| 8,493,976 B2 | 7/2013 | Lin |
| 8,693,811 B2 | 4/2014 | Morini et al. |
| 8,737,772 B2 | 5/2014 | Dong et al. |
| 8,774,625 B2 | 7/2014 | Binkert et al. |
| 8,792,787 B1 | 7/2014 | Zhao et al. |
| 8,817,354 B2 | 8/2014 | Feng et al. |
| 8,942,559 B2 | 1/2015 | Binkert et al. |
| 9,182,546 B2 | 11/2015 | Prosyk et al. |
| 9,329,415 B2 | 5/2016 | Song et al. |
| 9,438,970 B2 | 9/2016 | Jones et al. |
| 9,541,775 B2 | 1/2017 | Ayazi et al. |
| 2003/0031445 A1 | 2/2003 | Parhami et al. |
| 2003/0063362 A1 | 4/2003 | Demir et al. |
| 2003/0133641 A1 | 7/2003 | Yoo |
| 2003/0142943 A1 | 7/2003 | Yegnanarayanan et al. |
| 2004/0207016 A1 | 10/2004 | Patel et al. |
| 2006/0140528 A1 | 6/2006 | Coldren et al. |
| 2006/0257065 A1 | 11/2006 | Coldren et al. |
| 2007/0104441 A1 | 5/2007 | Ahn et al. |
| 2007/0280309 A1 | 12/2007 | Liu |
| 2009/0003841 A1 | 1/2009 | Ghidini et al. |
| 2009/0169149 A1 | 7/2009 | Block |
| 2009/0245298 A1 | 10/2009 | Sysak et al. |
| 2010/0060970 A1 | 3/2010 | Chen |
| 2010/0078680 A1 | 4/2010 | Cheng et al. |
| 2010/0080504 A1 | 4/2010 | Shetrit et al. |
| 2010/0128336 A1 | 5/2010 | Witzens et al. |
| 2010/0200733 A1 | 8/2010 | McLaren et al. |
| 2010/0290732 A1 | 11/2010 | Gill |
| 2011/0142390 A1 | 6/2011 | Feng et al. |
| 2011/0142391 A1 | 6/2011 | Asghari et al. |
| 2011/0180795 A1 | 7/2011 | Lo et al. |
| 2011/0293279 A1 | 12/2011 | Lam et al. |
| 2012/0080672 A1 | 4/2012 | Rong et al. |
| 2012/0189239 A1 | 7/2012 | Tu et al. |
| 2012/0207424 A1 | 8/2012 | Zheng et al. |
| 2012/0328292 A1 | 12/2012 | Testa et al. |
| 2013/0051727 A1 | 2/2013 | Mizrahi et al. |
| 2013/0051798 A1 | 2/2013 | Chen et al. |
| 2013/0094797 A1 | 4/2013 | Zheng et al. |
| 2013/0182305 A1 | 7/2013 | Feng et al. |
| 2013/0188902 A1 | 7/2013 | Gardes et al. |
| 2013/0315599 A1 | 11/2013 | Lam et al. |
| 2014/0341498 A1 | 11/2014 | Manouvrier |
| 2015/0277157 A1 | 10/2015 | Jones et al. |
| 2015/0293384 A1 | 10/2015 | Ogawa et al. |
| 2016/0080844 A1 | 3/2016 | Jones et al. |
| 2017/0082876 A1 | 3/2017 | Jones et al. |
| 2017/0155452 A1 | 6/2017 | Nagra et al. |
| 2018/0046057 A1 | 2/2018 | Yu et al. |

FOREIGN PATENT DOCUMENTS

| | | |
|---|---|---|
| EP | 1 761 103 A1 | 3/2007 |
| JP | 06-232384 A | 8/1994 |
| JP | 2004-163753 A | 6/2004 |
| JP | 2005-300678 A | 10/2005 |
| WO | WO 91/13375 A1 | 9/1991 |
| WO | WO 92/10782 A1 | 6/1992 |
| WO | WO 02/41663 A2 | 5/2002 |
| WO | WO 02/086575 A1 | 10/2002 |
| WO | WO 2008/024458 A2 | 2/2008 |
| WO | WO 2015/060820 A1 | 4/2015 |
| WO | WO 2016/154764 A2 | 10/2016 |
| WO | WO 2017/135436 A1 | 8/2017 |

OTHER PUBLICATIONS

Office Action issued in U.S. Appl. No. 14/629,922, dated May 11, 2016, 14 pages.

Office Action issued in U.S. Appl. No. 15/369,804, dated Jul. 6, 2017, 14 pages.

Office Action issued in U.S. Appl. No. 15/555,431, dated Apr. 6, 2018, 11 pages.

Office Action issued in U.S. Appl. No. 15/927,943, dated Jun. 15, 2018, 13 pages.

Dong, Po et al., "High-speed low-voltage single-drive push-pull silicon Mach-Zehnder modulators", Optics Express, Mar. 12, 2012, pp. 6163-6169, vol. 20, No. 6.

Fu, Enjin et al., "Traveling Wave Electrode Design for Ultra Compact Carrier-injection HBT-based Electroabsorption Modulator in a 130nm BiCMOS Process", Proc. of SPIE, 2014, 11 pages, vol. 8989.

International Search Report and Written Opinion of the International Searching Authority, dated Jun. 6, 2016, Corresponding to PCT/GB2016/050570, 13 pages.

International Search Report and Written Opinion of the International Searching Authority, dated Mar. 8, 2018, Corresponding to PCT/EP2017/080216, 14 pages.

Knoll, Dieter et al., "BiCMOS Silicon Photonics Platform for Fabrication of High-Bandwidth Electronic-Photonic Integrated Circuits", IEEE, 2016, pp. 46-49.

U.K. Intellectual Property Office Search and Examination Report, dated Mar. 13, 2018, for Patent Application No. GB1800519.9, 9 pages.

Vivien, Laurent et al. "High speed and high responsivity germanium photodetector integrated in a Silicon-On-Insulator microwaveguide," Optics Express, vol. 15, Issue 15, pp. 9843-9848 (2007).

"40Gb/s 2R Optical Regenerator (wavelength converter)", CIP Technologies, Preliminary Datasheet, Nov. 2013, 2 pages.

Bregni, Stefano et al., "Architectures and Performance of AWG-Based Optical Switching Nodes for IP Networks", IEEE Journal on Selected Areas in Communications, Sep. 2003, pp. 1113-1121, vol. 21, No. 7.

Dong, Po et al., "Wavelength-tunable silicon microring modulator", Optics Express, May 10, 2010, pp. 10941-10946, vol. 18, No. 11.

Durhuus, Terji et al., "All-Optical Wavelength Conversion by Semiconductor Optical Amplifiers", Journal of Lightwave Technology, Jun. 1996, pp. 942-954, vol. 14, No. 6.

Edagawa, Noboru et al., "Novel Wavelength Converter Using an Electroabsorption Modulator", IEICE Trans. Electron., Aug. 1998, pp. 1251-1257, vol. E81-C, No. 8.

(56) References Cited

OTHER PUBLICATIONS

Ellis, A.D. et al., "Error free 100Gbit/s wavelength conversion using grating assisted cross-gain modulation in 2mm long semiconductor amplifier", Electronics Letters, Oct. 1, 1998, pp. 1958-1959, vol. 34, No. 20.
Examination Report issued in GB 1403191.8 dated Dec. 2, 2015, 3 pages.
Feng, Dazeng et al., "High-Speed GeSi Electroabsorption Modulator on the SOI Waveguide Platform", IEEE Journal of Selected Topics in Quantum Electronics, Nov./Dec. 2013, 10 pages, vol. 19, No. 6.
Fidaner, Onur et al., "Integrated photonic switches for nanosecond packet-switched optical wavelength conversion", Optics Express, Jan. 9, 2006, pp. 361-368, vol. 14, No. 1.
Fidaner, Onur et al., "Waveguide Electroabsorption Modulator on Si Employing Ge/SiGe Quantum Wells", Optical Society of America, 2007, 1 page.
Foster, Mark A., "Broad-band continuous-wave parametric wavelength conversion in silicon nanowaveguides", Optics Express, Sep. 24, 2007, pp. 12949-12958, vol. 15, No. 20.
Geis, M.W. et al., "Silicon waveguide infrared photodiodes with >35 GHz bandwidth and phototransistors with 50 $AW^{-1}$ response", Optics Express, Mar. 18, 2009, pp. 5193-5204, vol. 17, No. 7.
Gripp, Jürgen et al., "Optical Switch Fabrics for Ultra-High-Capacity IP Routers", Journal of Lightwave Technology, Nov. 2003, pp. 2839-2850, vol. 21, No. 11.
Hsu, A. et al., "Wavelength Conversion by Dual-Pump Four-Wave Mixing in an Integrated Laser Modulator", IEEE Photonics Technology Letters, Aug. 2003, pp. 1120-1122, vol. 15, No. 8.
Hu, Hao et al., "Ultra-high-speed wavelength conversion in a silicon photonic chip", Optics Express, Sep. 26, 2011, pp. 19886-19894, vol. 19, No. 21.
Hussain, Ashiq et al., "Optimization of Optical Wavelength Conversion in SOI Waveguide", Applied Mechanics and Materials, 2012, 5 pages, vol. 110-116.
International Search Report and Written Opinion of the International Searching Authority, dated May 26, 2017, Corresponding to PCT/IT2017/000004, 13 pages.
International Search Report and Written Opinion of the International Searching Authority, dated Jun. 8, 2015, dated Jun. 15, 2015, and Received Jun. 15, 2015, Corresponding to PCT/GB2015/050523, 14 pages.
International Search Report and Written Opinion of the International Searching Authority, dated Jun. 8, 2015, dated Sep. 16, 2015, and Received Sep. 17, 2015, Corresponding to PCT/GB2015/050524, 18 pages.
International Search Report and Written Opinion of the International Searching Authority, dated Sep. 11, 2017, Corresponding to PCT/GB2017/051998, 15 pages.
Kachris, Christoforos et al., "Optical Interconnection Networks in Data Centers: Recent Trends and Future Challenges", IEEE Communications Magazine, Optical Technologies for Data Center Networks, Sep. 2013, pp. 39-45.
Lal, Vikrant et al., "Monolithic Wavelength Converters for High-Speed Packet-Switched Optical Networks", IEEE Journal of Selected Topics in Quantum Electronics, Jan./Feb. 2007, pp. 49-57, vol. 13, No. 1.
Leuthold, J. et al., "All-optical wavelength conversion between 10 and 100 Gb/s with SOA delayed-interference configuration", Optical and Quantum Electronics, 2001, pp. 939-952, vol. 33, Nos. 7-10.
Lever, L. et al., "Adiabatic mode coupling between SiGe photonic devices and SOI waveguides", Optics Express, Dec. 31, 2012, pp. 29500-29506, vol. 20, No. 28.
Liao, Ling et al., "High speed silicon Mach-Zehnder modulator", Optics Express, Apr. 18, 2005, pp. 3129-3135, vol. 13, No. 8.
Liu, Ansheng et al., "High-speed optical modulation based on carrier depletion in a silicon waveguide", Optics Express, Jan. 22, 2007, pp. 660-668, vol. 15, No. 2.
Liu, Y. et al., "Error-Free 320-Gb/s All-Optical Wavelength Conversion Using a Single Semiconductor Optical Amplifier", Journal of Lightwave Technology, Jan. 2007, pp. 103-108, vol. 25, No. 1.
Maxwell, G. et al., "WDM-enabled, 40Gb/s Hybrid Integrated All-optical Regenerator", ECOC 2005 Proceedings, 2005, pp. 15-16, vol. 6.
Meuer, Christian et al., "80 Gb/s wavelength conversion using a quantum-dot semiconductor optical amplifier and optical filtering", Optics Express, Mar. 3, 2011, pp. 5134-5142, vol. 19, No. 6.
Moerman, Ingrid et al., "A Review on Fabrication Technologies for the Monolithic Integration of Tapers with III-V Semiconductor Devices", IEEE Journal of Selected Topics in Quantum Electronics, Dec. 1997, pp. 1308-1320, vol. 3, No. 6.
Nakamura, Shigeru et al., "168-Gb/s All-Optical Wavelength Conversion With a Symmetric-Mach-Zehnder-Type Switch", IEEE Photonics Technology Letters, Oct. 2001, pp. 1091-1093, vol. 13, No. 10.
Neilson, David T., "Photonics for Switching and Routing", IEEE Journal of Selected Topics in Quantum Electronics, Jul./Aug. 2006, pp. 669-678, vol. 12, No. 4.
Ngo, Hung Q. et al., "Constructions and Analyses of Nonblocking WDM Switches Based on Arrayed Waveguide Grating and Limited Wavelength Conversion", IEEE/ACM Transactions on Networking, Feb. 2006, pp. 205-217, vol. 14, No. 1.
Ngo, Hung Q. et al, "Nonblocking WDM Switches Based on Arrayed Waveguide Grating and Limited Wavelength Conversion", Proceedings from the 23rd Conference of the IEEE Communications Society, 2004, 11 pages.
Nishimura, Kohsuke et al., "Optical wavelength conversion by electro-absorption modulators", Active and Passive Optical Components for WDM Communications IV, Proceedings of SPIE, 2004, pp. 234-243, vol. 5595.
"Quad 40Gb/s 2R Optical Regenerator", CIP Technologies, Preliminary Datasheet, Nov. 2013, 2 pages.
Reed, Graham T. et al., "Silicon optical modulators", Materials Today, Jan. 2005, pp. 40-50, vol. 8, No. 1.
Roelkens, Gunther et al., "III-V-on-Silicon Photonic Devices for Optical Communication and Sensing", Photonics, 2015, 29 pages, vol. 2, No. 3.
Rouifed, Mohamed-Saïd et al., "Advances Toward Ge/SiGe Quantum-Well Waveguide Modulators at 1.3μm", IEEE Journal of Selected Topics in Quantum Electronics, Jul./Aug. 2014, 7 pages, vol. 20, No. 4.
Segawa, Toru et al., "All-optical wavelength-routing switch with monolithically integrated filter-free tunable wavelength converters and an AWG", Optics Express, Feb. 17, 2010, pp. 4340-4345, vol. 18, No. 5.
Stamatiadis, C. et al., "Fabrication and experimental demonstration of the first 160 Gb/s hybrid silicon-on-insulator integrated all-optical wavelength converter", Optics Express, Feb. 1, 2012, pp. 3825-3831, vol. 20, No. 4.
Stubkjaer, Kristian E., "Semiconductor Optical Amplifier-Based All-Optical Gates for High-Speed Optical Processing", IEEE Journal on Selected Topics in Quantum Electronics, Nov./Dec. 2000, pp. 1428-1435, vol. 6, No. 6.
Summers, Joseph A. et al., "Monolithically Integrated Multi-Stage All-Optical 10Gbps Push-Pull Wavelength Converter", Optical Fiber Communication Conference, 2007, 3 pages, Anaheim, CA, USA.
Sysak, M.N. et al., "Broadband return-to-zero wavelength conversion and signal regeneration using a monolithically integrated, photocurrent-driven wavelength converter", Electronics Letters, Dec. 7, 2006, 2 pages, vol. 42, No. 25.
Tauke-Pedretti, Anna et al., "Separate Absorption and Modulation Mach-Zehnder Wavelength Converter", Journal of Lightwave Technology, 2008, pp. 1-8, vol. 26, No. 1.
Turner-Foster, Amy C. et al., "Frequency conversion over two-thirds of an octave in silicon nanowaveguides", Optics Express, Jan. 15, 2010, pp. 1904-1908, vol. 18, No. 3.
U.K. Intellectual Property Office Examination Report, dated Aug. 10, 2017, for Patent Application No. GB1420064.6, 5 pages.
U.K. Intellectual Property Office Search Report, dated Aug. 6, 2014, Received Aug. 8, 2014, for Patent Application No. GB1403191.8, 5 pages.

(56) References Cited

OTHER PUBLICATIONS

U.K. Intellectual Property Office Search Report, dated Jul. 13, 2017, for Patent Application No. GB1706331.4, 3 pages.
U.K. Intellectual Property Office Search Report, dated Jun. 10, 2015, Received Jun. 12, 2015, for Patent Application No. GB1420063.8, 4 pages.
U.K. Intellectual Property Office Search Report, dated Sep. 5, 2014, Received Sep. 10, 2014, for Patent Application No. GB1403191.8, 2 pages.
Vivien, L. et al., "High speed silicon modulators and detectors", ACP Technical Digest, Communications and Photonics Conference, Nov. 7, 2012, 3 pages.
Vlachos, Kyriakos et al., "Photonics in switching: enabling technologies and subsystem design", Journal of Optical Networking, May 2009, pp. 404-428, vol. 8, No. 5.
Wang, J. et al., "Evanescent-Coupled Ge p-i-n. Photodetectors on Si-Waveguide With SEG-Ge and Comparative Study of Lateral and Vertical p-i-n. Configurations", IEEE Electron Device Letters, May 2008, pp. 445-448, vol. 29, No. 5.
Yao, Shun et al., "A Unified Study of Contention-Resolution Schemes in Optical Packet-Switched Networks", Journal of Lightwave Technology, 2003, 31 pages, vol. 21, No. 3.
Ye, Tong et al., "AWG-based Non-blocking Clos Networks", Aug. 21, 2013, pp. 1-13.
U.K. Intellectual Property Office Search and Examination Report, dated Sep. 12, 2017, Received Sep. 15, 2017, for Patent Application No. GB1711525.4, 5 pages.
U.K. Intellectual Property Office Examination Report, dated Aug. 20, 2018, for Patent Application No. GB 1711525.4, 4 pages.

OPTOELECTRONIC DEVICE

CROSS-REFERENCE TO RELATED APPLICATION(S)

The present application claims priority to and the benefit of U.S. Provisional Application No. 62/528,900, filed Jul. 5, 2017, and claims priority to foreign application No. 1711525.4, filed in Great Britain on Jul. 18, 2017, the entire content of both of which is incorporated herein by reference.

FIELD

The present invention relates to optoelectronic devices, and particularly to optoelectronic devices with no buried oxide layer or other insulating layer between an optically active region and a substrate.

BACKGROUND

Conventional optoelectronic devices (for example, electro-absorption modulators or EAMs) comprise a waveguide on a base that is generally a semiconductor substrate such as a silicon substrate. Waveguides built upon this base comprise three layers: a core layer, a bottom cladding layer, and an upper cladding layer; which are configured to guide a light signal through the core layer by total internal reflection. The core layer is a light-transmitting medium, which is fabricated in a silicon layer located on top of an insulating layer such as a buried oxide or BOX layer. The BOX layer, as part of the waveguide (bottom cladding) is located on top of the silicon substrate and functions to confine the light into the light-transmitting medium. An optoelectronic device may comprise a waveguide with an optically active region (also referred to as an active waveguide), for example an electro-absorption medium, deposited in a cavity in the silicon layer (i.e. atop the BOX layer). Typically, a thin silicon layer is left on the bottom of the cavity between the BOX layer and the optically active region as a crystal seed for the active material to be grown epitaxially. Both the silicon seed layer and the BOX layer may function as the bottom cladding for the active waveguide. Usually, the epitaxial growth for the active material needs a further active material seed layer located upon the silicon seed layer in order to obtain a high quality crystal structure of the desired active region. For example, a seed layer of germanium may be grown when an active layer of silicon-germanium is to be grown. The uniform and continuous silicon layer must be kept relatively thin so as to maintain the coupling efficiency between a passive waveguide (e.g. a non-optically active waveguide) and the active waveguide at a useful level. In previous optoelectronic devices, the thickness of the silicon layer is around 0.2 µm.

To fabricate a known EAM as described above from a silicon wafer, the silicon layer above the BOX must be etched to a thickness of around 0.2 µm from an initial thickness of around 3 µm. It is difficult to do this consistently, and so problems with yield may arise.

Known optoelectronic devices which operate at 1310 nm wavelengths suffer from a number of issues. For example, in Mach-Zehnder interferometer based devices operating at this wavelength have a very large footprint on a photonic circuit, which can result in a very large parasitic capacitance and thus require a distributed electrode and transmission line design. Quantum-confined Stark effect devices operating at this wavelength show a high polarization dependency (which means that they may only support a single polarization such as TE mode and they exhibit a high sensitivity to manufacturing process tolerance (particularly in relation to the evanescent coupling and taper structure dimensions).

Until now, it has been accepted that a silicon seed layer and a BOX layer are necessary beneath the optically active region as bottom cladding in order to make the optoelectronic device function. However, the inventors have realised that the silicon seed layer and the BOX layer are not necessary and can be replaced by other material that has a crystal structure with a lower refractive index than that of the optically active region.

SUMMARY

At its broadest, the invention provides an optoelectronic device with a regrown cladding layer below an optically active region. For example, a silicon-on-insulator (SOI) wafer, where a portion of the buried oxide has been removed, and a cladding layer regrown in its place.

Accordingly, in a first aspect, the invention provides an optoelectronic device, comprising an optically active region and a substrate; wherein there is no insulating layer (such as buried oxide) between the optically active region and the substrate. The substrate may be a silicon substrate.

Between the optically active region and the substrate there may be a silicon or SiGe cladding layer; and an upper surface of the silicon or SiGe cladding layer may abut a bottom surface of the optically active region; and a lower surface of the silicon or SiGe cladding layer may abut an upper surface of the substrate.

In a second aspect, the invention provides an optoelectronic device, comprising: a substrate; a regrown cladding layer, on top of the substrate; and an optically active region, above the regrown cladding layer; wherein the regrown cladding layer has a refractive index which is less than a refractive index of the optically active region, such that an optical mode of the optoelectronic device is confined to the optically active region.

Advantageously, the coupling loss between a passive waveguide (connected or connectable to the optically active region) and the optically active region according to the invention is smaller than that between the same regions in a prior art device that has a buried oxide layer. Moreover, it is possible to tune the height of the cladding layer to optimize mode match which can result in lower device losses, and higher yield in device fabrication. Furthermore, the absence of a buried oxide layer between the cladding layer and the optically active region can remove or diminish RF parasitic capacitance (e.g. by removal of $C_{ox}$ capacitance) which may result in a higher device speed.

By regrown, it may be meant that the cladding layer is provided as a layer grown from the substrate or an intermediate layer. The cladding layer may be directly on top of the substrate. Alternatively, the cladding layer may be separated from the substrate by a seed layer (for example, a germanium seed layer), or the cladding layer may function as a seed layer. The seed layer can help ensure that the crystal structure of the cladding layer and the optical active region is of good quality and have low defect density, as well as encouraging growth along the correct crystal axis. In some embodiments, the seed layer is kept thin, for example less than or equal to the thickness of the BOX in the passive waveguides and from around 100 nm to 400 nm, as this will help minimise loss. Generally, the top surface of the seed layer should be lower than or equal to the top surface of the BOX layer in the adjacent passive waveguides. The substrate may be a silicon substrate.

The optically active region may be one of: an electro-absorption modulator; or a photodiode. The electro-absorption modulator may operate by the Franz-Keldysh or Quantum-confined Stark effects.

The cladding layer may be formed of silicon. The silicon may be epitaxially grown silicon. The cladding layer may be formed of a material which is not a buried oxide. The cladding layer may be formed from silicon germanium (SiGe), germanium (Ge), indium phosphide (InP), or may be a combination of a SiGe and Ge layer. Where there is a seed layer between the substrate and the cladding layer, the cladding layer may further act to isolate any optical losses which might be caused by the seed layer. The optically active region may be formed of SiGe or SiGeSn having a first composition and the cladding layer may be formed of SiGe or SiGeSn having a second composition different from the first composition. In this example, there may be a germanium seed layer or a SiGe layer, functional as a seed layer, disposed between the cladding layer and the silicon layer. The optically active region may be formed of SiGeSn, and the cladding layer may be formed of SiGe. The optically active region may be formed of any one of: SiGeSn, GeSn, InGaNAs, and InGaNAsSb.

The device may further comprise a germanium seed layer between the cladding layer and the optically active region. Alternatively, the seed layer may be SiGe or SiGeSn.

The device may further comprise an insulating layer (for example, a buried oxide layer), disposed on a first and/or second horizontal side of the cladding layer, wherein the cladding layer has a height from the substrate which is substantially equal to or greater than that of the insulating (e.g. buried oxide) layer. The cladding layer is formed of a material different from the buried oxide layer. The insulating (e.g. buried oxide) layer may extend under a portion of a slab of the optically active region i.e. the regrown cladding layer may not be as wide as the optically active region (in a horizontal direction), the optically active region also comprising a rib under which the cladding layer is disposed.

The optically active region may be disposed within a cavity of a silicon-on-insulator layer which is disposed above the substrate. The optically active region may be formed of any of: SiGe, SiGeSn, an SiGe multiple quantum well (MQW) epitaxially grown stack, or an InP-based MQW epitaxially grown stack. The optically active region may be formed of $Si_xGe_{1-x-y}Sn_y$, where 5%≤x≤20%, and 1%≤y≤10%. Such a device may be operable at an optical wavelength of 1310 nm, and may have a length of the optically active region of between 30 μm and 60 μm. The device may be driveable at a voltage of between 1.8 V-2 V which may be measured peak to peak and applied as a reversed bias. Advantageously, such a device is less polarization dependent than previous 1310 nm devices and the performance of the device is generally less sensitive to process variation.

The optically active region may be capped with a capping layer.

The device may further comprise an input waveguide, coupled to a first side of the optically active region; and an output waveguide, coupled to a second side of the optically active region; wherein the interface between the input waveguide and the optically active region and the interface between the output waveguide and the optically active region are at an angle greater than 0° relative to a guiding direction of the input waveguide and/or output waveguide.

The optically active region may include an SiGe or SiGeSn optical waveguide, and the waveguide may comprise a junction region and a plurality of electrodes for providing a bias across the junction to enable use of the Franz-Keldysh effect, Quantum-confined Stark effect, or control of the phase of light traveling through the junction region via dispersion.

In an embodiment, the optically active region may include a waveguide ridge, and may have: an upper surface and a lower surface; a lower doped region, located at and/or adjacent to at least a portion of the lower surface of the optically active region, and extends laterally outwards from the waveguide ridge in a first direction; an upper doped region, located at and/or adjacent to at least a portion of the upper surface of the waveguide ridge of the optically active region, and extends laterally outwards from the waveguide ridge in a second direction; and an intrinsic region located between the lower doped region and the upper doped region.

In this embodiment, a first electrode may contact the lower doped region at a first contact surface and a second electrode may contact the upper doped region at a second contact surface; the first contact surface may be laterally offset from the waveguide ridge in a first direction; and the second contact surface may be laterally offset from the waveguide ridge in a second direction. The first and second contact surfaces may be aligned with one another along a lateral plane.

In this embodiment, the upper doped region may comprise a first doped zone and a second doped zone. The dopant concentration in the second doped zone of the upper doped region may be higher than the dopant concentration in the first doped zone of the upper doped region; and the second doped zone of the upper doped region may comprise the second contact surface. The first doped zone of the upper doped region may be at and/or adjacent to the upper surface of the waveguide ridge of the OAR (Optically Active Region), and the second doped zone is located at a position which is laterally displaced from the waveguide ridge in the second direction.

In this embodiment, the lower doped region may comprise a first doped zone and a second doped zone. The dopant concentration in the second doped zone of the lower doped region may be higher than the dopant concentration in the first doped zone of the lower doped region; and the second doped zone of the lower doped region may comprise the first contact surface. The first doped zone of the lower doped region may be located directly underneath the OAR; and the second doped zone of the lower doped region may be located within the OAR, laterally displaced from the waveguide ridge, the second doped zone of the lower doped region may have an upper surface which comprises the first contact surface, and a lower surface which is in direct contact with the first doped zone of the lower doped region. The second doped zone of the lower doped region may be located within a portion of the OAR having a reduced height. The portion of the OAR having a reduced height may be a portion of the OAR which has been etched before the dopant species of the lower doped region is added.

In this embodiment. The first doped zone of the lower doped region may be located directly underneath the OAR. The OAR may include a slab which extends in the first direction, the slab may exhibit a via through its thickness at a location laterally displaced from the waveguide ridge in the first direction; and the second doped zone of the lower doped region may be located within the first doped zone, directly underneath the via.

In this embodiment, the lower doped region may be partially adjacent to the lower surface of the OAR and may be partially migrated into the OAR at the lower surface.

In this embodiment, the upper doped region may be fully located within the OAR.

In this embodiment, the OAR may be formed from an electro-absorption material in which the Franz-Keldysh effect occurs in response to the application of an applied electric field.

In this embodiment, the OAR may be formed from a light absorbing material which is suitable for generating a current upon detection of light and electrons to be swept out when a voltage bias is applied across the upper and lower doped regions.

In this embodiment, the optically active region may include a waveguide ridge, a first slab on a first side of the waveguide ridge and a second slab on a second side of the waveguide ridge, the OAR may have an upper surface and a lower surface. The lower doped region may be located adjacent to a portion of a lower surface of the OAR; the lower doped portion may also extend laterally along and adjacent to the first slab of the OAR, away from the ridge in a first direction. The upper doped region may be located within at least a portion of an upper surface of the ridge of the OAR, and may extend laterally outwards along the second slab of the OAR in a second direction. The lower doped region, which may be located adjacent to a portion of a lower surface of the OAR, may migrate into the OAR at the same portion of the lower surface of the OAR.

In an embodiment, the optically active region may include a rib waveguide modulation region, the rib waveguide modulation region having: a ridge extending from the cladding layer; a first slab region at a first side of the ridge and a second slab region at a second side of the ridge; and wherein: a first doped region extends along: the first slab region and along a first side wall (or "sidewall") of the ridge, the first sidewall contacting the first slab region; and a second doped region extends along: the second slab region and along a second sidewall of the ridge, the second sidewall contacting the second slab region.

In a different embodiment, the optically active region may include a rib waveguide modulation region, the rib waveguide modulation region having: a ridge extending from the cladding layer, and all of the ridge, or at least a portion of the ridge being formed from a material which is different from the material of the cladding layer; wherein the rib waveguide modulation region includes a first slab region at a first side of the ridge and a second slab region at a second side of the ridge. A first doped region may extend along: the first slab region and along a first side wall of the ridge, the first sidewall contacting the first slab region. A second doped region may extend along: the second slab region and along a second sidewall of the ridge, the second side wall contacting the second slab region.

In an embodiment, the optically active region may include a rib waveguide modulation region, the rib waveguide modulation region having: a ridge extending from the cladding layer, at least a portion of the ridge being formed from a chosen semiconductor material which is different from the material of the cladding layer; a first slab region at a first side of the ridge and a second slab region at a second side of the ridge; and either the first slab region or the second slab region is the material of the cladding layer; and wherein: a first doped region extends along: the first slab region and along a first side wall of the ridge, the first sidewall contacting the first slab region; and a second doped region extends along: the second slab region and along a second sidewall of the ridge, the second sidewall contacting the second slab region.

In a different embodiment, the optically active region may further include a rib waveguide modulation region, the rib waveguide modulation region having: a silicon base, disposed on top of the cladding layer; a ridge extending from the silicon base, at least a portion of the ridge being formed from a chosen semiconductor material which is different from the material of the silicon base. The silicon base may include a first slab region at a first side of the ridge, and a second slab region at a second side of the ridge. A first doped region may extend along: the first slab region and along a first sidewall of the ridge, the first sidewall contacting the first slab region. A second doped region may extend along: the second slab region and along a second sidewall of the ridge, the second sidewall contacting the second slab region.

In this, or the previous embodiment, the chosen semiconductor material may be silicon germanium (SiGe) or silicon germanium tin (SiGeSn). The chosen semiconductor material may be a GeSn alloy grown on Si or on an III-V semiconductor.

In this, or the previous embodiment, the device may further comprise a first electrical contact located on the first slab region of the silicon base or cladding layer and a second electrical contact located on the second slab region of the silicon base or cladding layer. The first doped region may be n doped and the second doped region may be p doped.

In this embodiment, the ridge may comprise: a lower ridge portion in contact with and extending away from the base; the base and lower ridge portion being formed from silicon; and an upper ridge portion in contact with and extending away from the lower ridge portion, the upper ridge portion being formed from the chosen semiconductor material. The first doped region which extends along the first sidewall may include a lower sidewall portion located at the first ridge portion and an upper sidewall region located at the second ridge portion. The second doped region which extends along the second sidewall may include a lower sidewall portion located at the first ridge portion and an upper sidewall region located at the second ridge portion. The lower sidewall portions and slab regions may have a higher dopant concentration than the upper sidewall portions. The lower sidewall portions may have a higher dopant concentration than the upper sidewall dopant concentrations, and the slab regions of the doped regions may have a higher dopant concentration than the lower sidewall portion. A distance ($d_{np2}$, $d_{pp2}$) by which the first and second lower sidewall portions extend into the ridge may be greater than the distance ($d_n$, $d_p$) by which the first and second upper sidewall portions extend into the ridge.

In this, or the previous embodiment, the device may include an input rib waveguide coupled to the input of the rib waveguide modulation region to couple light into the rib waveguide modulation region, and an output rib waveguide coupled to the output of the rib waveguide modulation region to couple light out of the rib waveguide modulation region.

In this, or the previous embodiment, the height of the base or cladding layer ($h_2$) and the height of the lower sidewall portions ($h_3$) may be chosen such that the mode center of the rib waveguide is located at the same height above the base or cladding layer as the mode center of the input and/or output waveguide(s).

The optically active region may include a waveguide ridge; and a waveguide slab; and at least one of: a sidewall of the ridge; a portion of the slab; the entirety of the slab; a portion of the ridge adjacent to the slab; both sidewalls of the ridge; may be formed of crystalline or amorphous silicon and contains dopants. The remainder of the waveguide slab may be formed from SiGe, SiGeSn or germanium.

In this embodiment, it may be that a portion of the slab and an adjacent sidewall are formed of crystalline or amorphous silicon. In such an example, the portion of the slab and the adjacent sidewall may contain dopants of a same species. In addition, it may be that a further portion of the slab and a further adjacent sidewall are formed of crystalline or amorphous silicon, and so both sidewalls and both portions of the slab either side of the ridge may be formed of crystalline or amorphous silicon. In this example, the further portion of the slab and the further adjacent sidewall contain dopants of a different species to those contained in the first portion of the slab and the first adjacent sidewall. Alternatively, the entire waveguide slab may be formed of crystalline or amorphous silicon, as well as a portion of the ridge which is adjacent to the slab, such that the crystalline or amorphous silicon forms an inverted 'T' shape. In such examples, a portion of the waveguide slab may contain dopants of a first species and a different portion of the waveguide slab may contain dopants of a second species. In addition to this, it may be that one or both sidewalls are formed of crystalline or amorphous silicon. In examples where only one sidewall is formed of crystalline or amorphous silicon (containing dopants), the other sidewall is formed from an active material (for example SiGe or SiGeSn) which is also doped. The sidewalls in such examples may contain dopants, and respectively contain dopants of a different species. Advantageously, such arrangements are easier to manufacture. Moreover, devices having at least one electrical contact disposed on a doped Si portion display improved series resistance which can improve the bandwidth and linearity of optical power.

In a third aspect, the invention provides an optoelectronic device, formed on a silicon-on-insulator wafer comprising a substrate, an insulating layer (e.g. a buried oxide layer), and a silicon-on-insulator layer, comprising: a cladding layer, formed of a different material to the material of the insulating layer, on top of the substrate; and an optically active region, above the cladding layer; wherein the cladding layer has a refractive index which is less than a refractive index of the optically active region such that an optical mode of the optoelectronic device is confined to the optically active region, and wherein the insulating layer does not extend below the optically active region.

The optoelectronic device of the third aspect may have any of the features discussed with relation to the optoelectronic device of the second aspect.

In a fourth aspect, the invention provides a method of manufacturing an optoelectronic device from a silicon-on-insulator wafer comprising a substrate, an insulating layer (e.g. a buried oxide layer), and a silicon-on-insulator layer, the method comprising the steps of: etching a cavity into the wafer, such that a depth of the cavity extends to at least an upper surface of the substrate; growing a cladding layer onto the upper surface of the substrate; growing an optically active material onto the cladding layer, wherein the cladding layer has a refractive index which is less than a refractive index of the optically active material; and etching the optically active material so as to form an optically active region above the cladding layer.

Advantageously, a better uniformity in slab height can be achieved due to there being less etch variability. Therefore the devices may be easier to manufacture and/or result in higher yields.

The step of etching a cavity into the wafer may comprise: a first etching step, where the insulating (e.g. buried oxide) layer is used as an etch-stop; and a second etching step, where the substrate is used as an etch-stop.

The method may include a step, before growing the cladding layer, of growing a seed layer onto the upper surface of the substrate such that the cladding layer grows from the seed layer.

The method may include a further step after growing the optically active material of planarizing the grown optically active material.

The method may include a step, after growing the optically active material and before etching the optically active material, or disposing a hard mask on top of at least a part of the grown optically active region.

The method may include a step, after etching the optically active material, of: doping the optically active region with dopants of a first and second species, so as to provide an electro-absorption modulator.

In a fifth aspect, the invention provides an optoelectronic device comprising: a waveguide slab, disposed on top of an insulating layer (e.g. a buried oxide layer); and a waveguide ridge, disposed on top of the waveguide slab; wherein at least one of: a sidewall of the ridge; a portion of the slab; the entirety of the slab; a portion of the ridge adjacent to the slab; both sidewalls of the ridge; are formed of crystalline or amorphous silicon and contain dopants.

In this embodiment, it may be that a portion of the slab and an adjacent sidewall are formed of crystalline or amorphous silicon. In addition, it may be that a further portion of the slab and a further adjacent sidewall are formed of crystalline or amorphous silicon, and so both sidewalls and both portions of the slab either side of the ridge may be formed of crystalline or amorphous silicon. Alternatively, the entire waveguide slab may be formed of crystalline or amorphous silicon, as well as a portion of the ridge which is adjacent to the slab, such that the crystalline or amorphous silicon forms an inverted 'T' shape. In addition to this, it may be that one or both sidewalls are formed of crystalline or amorphous silicon.

A first sidewall and second sidewall of the waveguide ridge may be respectively doped with dopants of a first species and dopants of a second species. A first side of the waveguide slab, adjacent to the first sidewall, and a second side of the waveguide slab, adjacent to the second sidewall, may be respectively doped with dopants of a first species and dopants of a second species. The remainder of the waveguide ridge and waveguide slab may be formed of SiGe or germanium.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
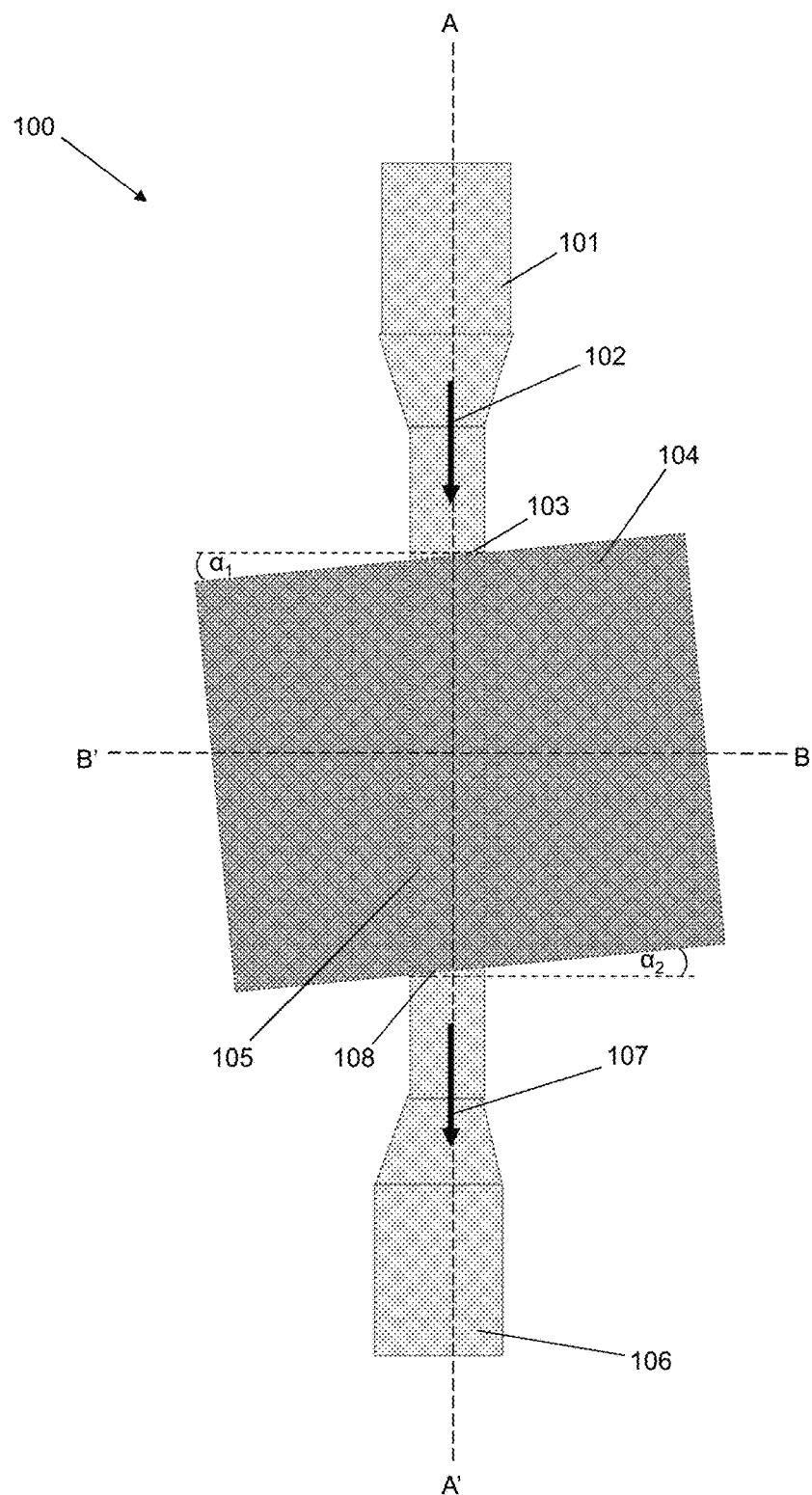
FIG. 1 shows a plan view of an optoelectronic device.

FIG. 1 is a plan view of an optoelectronic device 104 as disposed on a chip 100. An input waveguide 101 is operable to guide a light signal along direction 102 and through an interface 103 into the device. The interface between the input waveguide and the device is at an angle $\alpha_1$ relative to the guiding direction 102 of the light. The angle $\alpha_1$ may take a value between 0° and 10°. In some embodiments $\alpha_1$ is approximately 8°.

The light signal, having passed through the interface into the device 104, enters an optically active region (OAR) 105 where it may be processed or modified. For example, the optically active region may be a photodiode or an electro-absorption modulator. Depending on the nature of the optically active region, the light signal may then exit the OAR and device 104 via interface 108, into an output waveguide 106.

The output waveguide 106 guides light in direction 107, and the interface 108 may be at an angle $\alpha_2$ relative to the guiding direction 107 of the light in the output waveguide. As with angle $\alpha_1$, the angle $\alpha_2$ may take a value between 0° and 10°. In some embodiments $\alpha_2$ is approximately 8°, and is generally equal to $\alpha_1$.

Figure 2A:
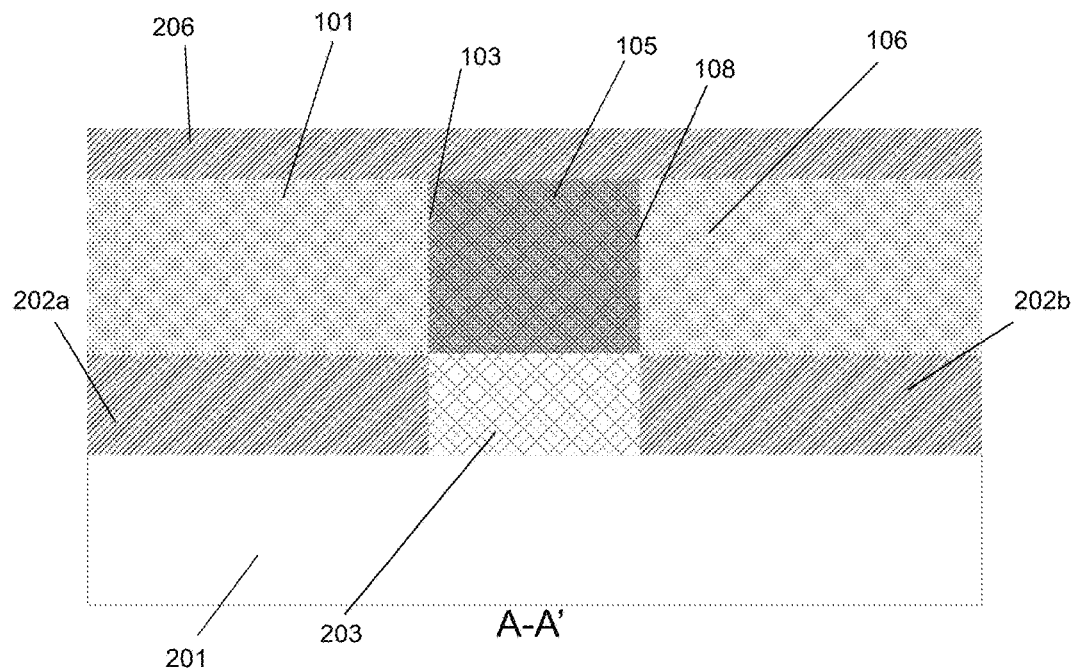
FIG. 2A shows a cross-sectional view of the device of FIG. 1 along the line A-A'.

FIG. 2A is a cross-sectional view of the device 104 shown in FIG. 1, along the line A-A'. The device 104 comprises a silicon substrate 201 which is a lowermost layer of the device. Disposed on top of the substrate are two buried oxide (BOX) layers 202a and 202b; and, between the buried oxide layers, is a cladding layer 203 which may be Si or SiGe. On top of the cladding layer is an optically active region 105 which is connected on either side to the input waveguide 101 and output waveguide 106. The interfaces 103 and 108 between the waveguides and the OAR are shown. A capping SiO$_2$ layer 206 is shown in this figure. Notably, the buried oxide layers 202a and 202b do not extend under the optically active region 105. The buried oxide layers may extend partially under a slab of the ridge waveguide, i.e. under doped regions 210 and 211.

Figure 2B:
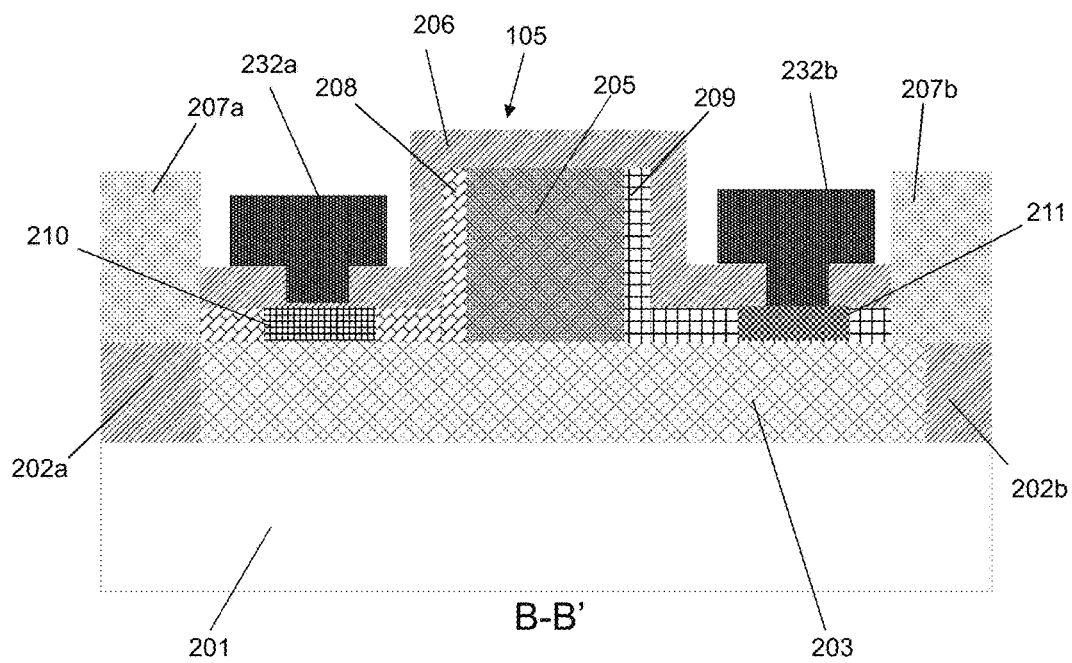
FIG. 2B shows a cross-sectional view of the device of FIG. 1 along the line B-B'.

FIG. 2B is a cross-sectional view of the device 104 shown in FIG. 1, along the line B-B'. This figure shows in more detail an example of the optically active region 105. Disposed on top of the cladding layer is a waveguide that comprises an intrinsic part 205, a first doped region 208 and a second doped region 209 which are the same material as the intrinsic part 205. Alternatively, either doped region 208 or 209, or both doped region 208 or 209, may be made of different material from the intrinsic part 205 such as Si or SiGe. The doped regions 208 and 209 extend along an upper surface of the cladding layer 203, and up sidewalls of the intrinsic part 205. The dopants in the first doped region are of a different species to the dopants in the second doped region.

A first portion 210 of the first doped region 208 is heavily doped in comparison to the remaining first doped region. This portion 210 is connected to an electrode 232a, which extends through the capping SiO$_2$ layer 206. Similarly, a second portion 211 of the second doped region 209 is heavily doped in comparison to the remaining second doped region. This portion 211 is connected to a second electrode 232b, which extends through the capping layer 206. The OAR 105 is generally located in a cavity of a silicon layer, the cavity being partially defined by silicon sidewalls 207a and 207b. The intrinsic part 205 in this example is undoped, and so the OAR can be described as a p-i-n junction. As the intrinsic part 205 extends away from the cladding layer, it may be described as a proud or rib waveguide where the rib is provided by the intrinsic part 205 and a part of first 208 and second 209 doped regions which extend up the side of the intrinsic part 205 and the slab is provided by a part of the doped regions 208 and 209 which extends along the upper surface of the cladding layer 203. The rib waveguide may have a height of around 2.8 μm as measured from the upper surface of the cladding layer, and the slabs may have a height of around 200 nm. The width of the rib waveguide (i.e. the horizontal distance between the parts of the first and second doped regions which extend up the side of the intrinsic part 205) may be around 0.8 μm. The cladding layer may be approximately 400 nm thick (i.e. as measured from the uppermost surface of the silicon substrate to the uppermost surface of the cladding layer). In such examples, the coupling efficiency from the input waveguide into the rib waveguide has been computed as approximately 99% for TE mode and 98.7% for TM mode.

The cladding layer 203 functions to confine light signals entering the OAR into the rib waveguide. It does so primarily by being formed of a material having a refractive index which is less than that of the OAR. For example, the cladding layer may be formed of a silicon layer which may be epitaxially grown or deposited using chemical vapour deposition which can have a refractive index of 3.3 to 3.8. In contrast, the OAR (also referred to as the waveguide core) may be formed primarily of silicon germanium (SiGe) which can have a refractive index of 4.0-4.7. This change in refractive index across the interface between the OAR and cladding layer may provide enough index contrast (i.e. $\Delta n$) to confine the light signals to the waveguide. It is notable that good confinement can be achieved without a buried oxide layer below the OAR, as discussed above.

Figure 3A:
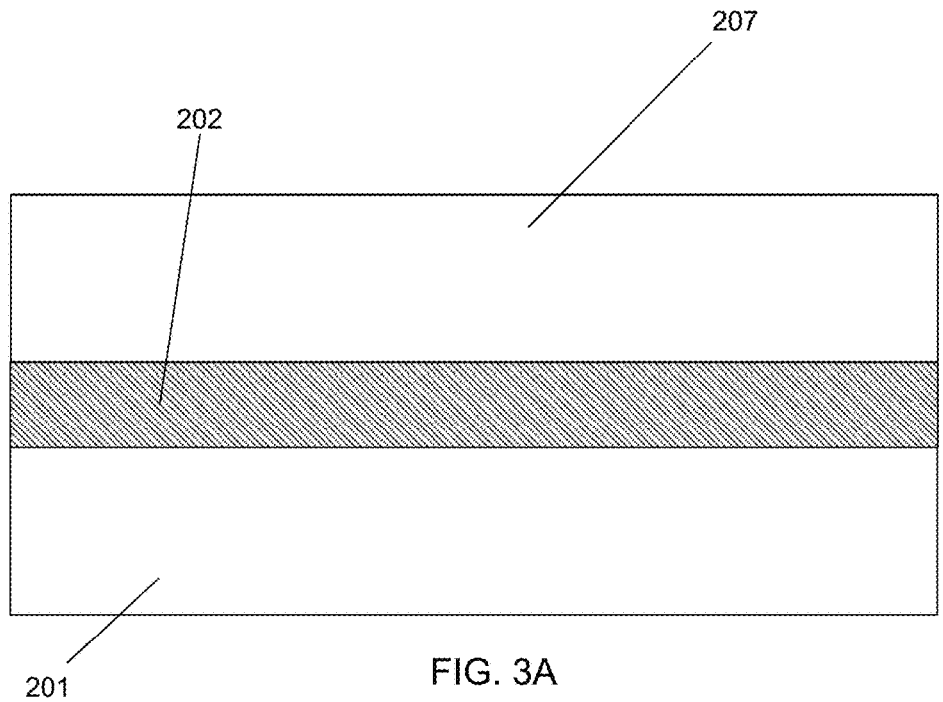
FIGS. 3A-3P show various manufacturing steps.
Figure 3B:
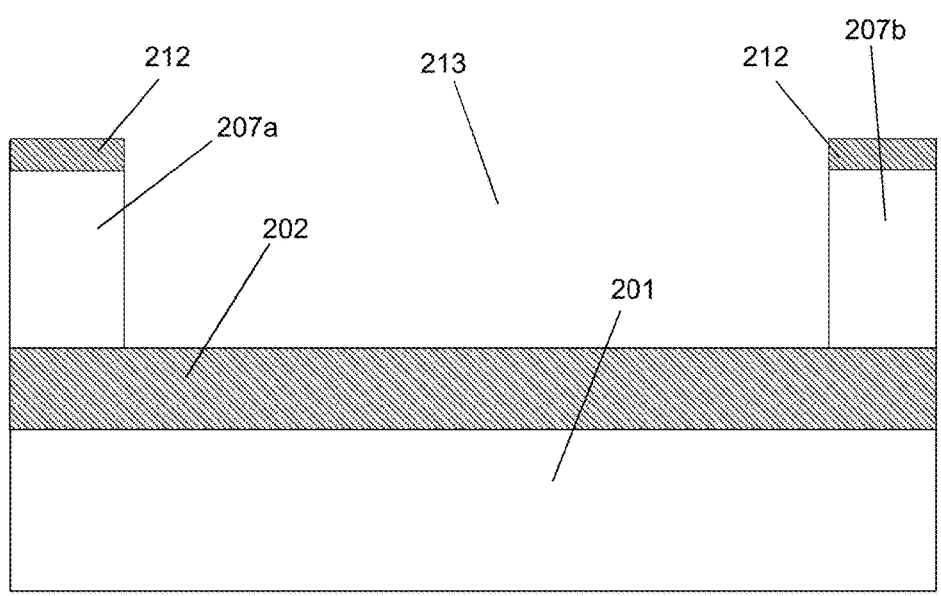
Figure 3C:
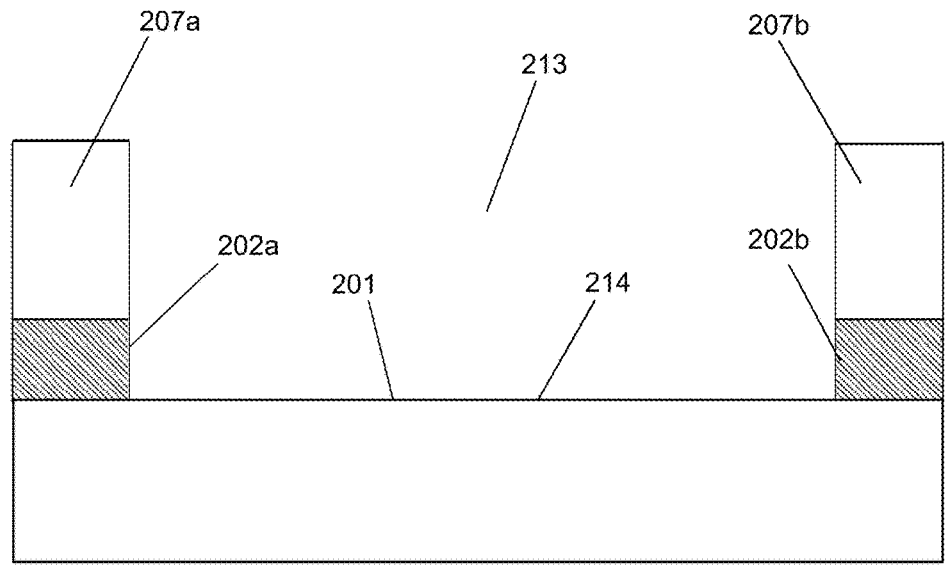
Figure 3D:
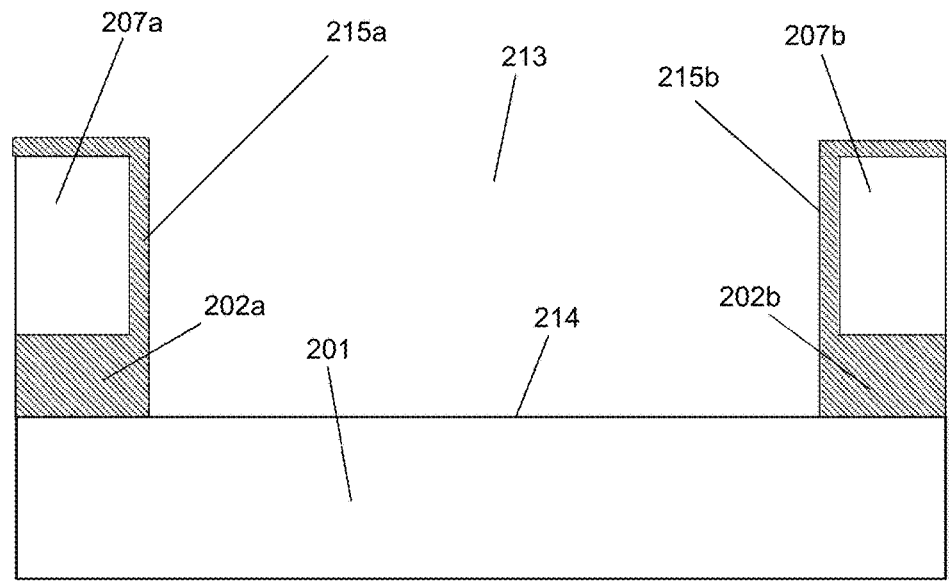
Figure 3E:
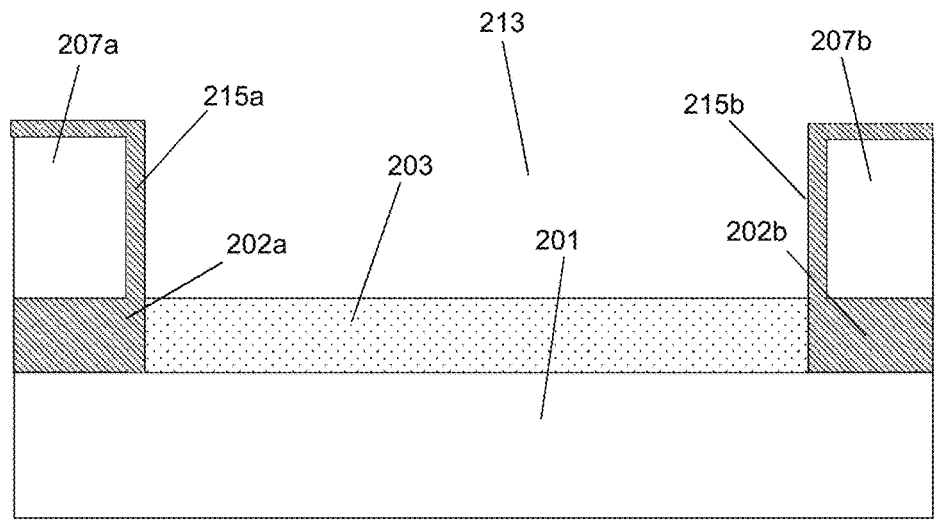
Figure 3F:
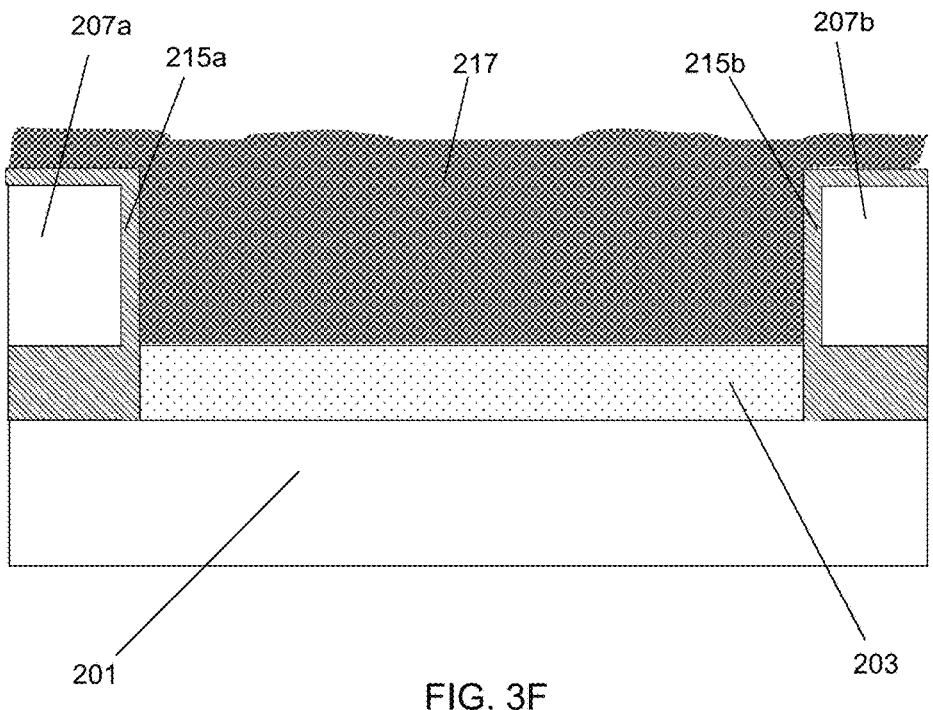
Figure 3G:
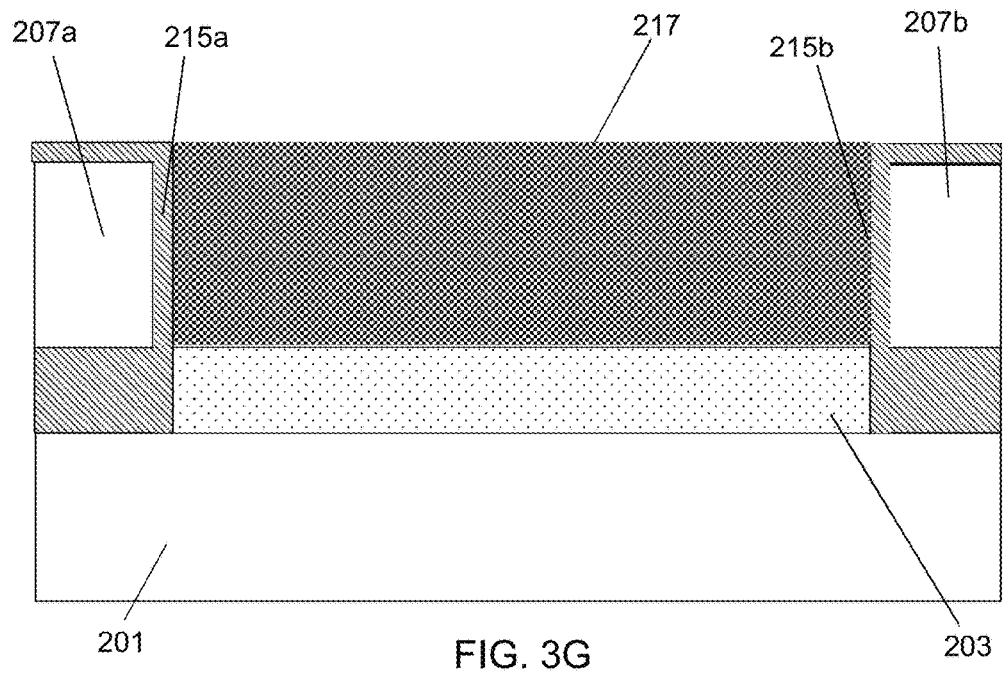
Figure 3H:
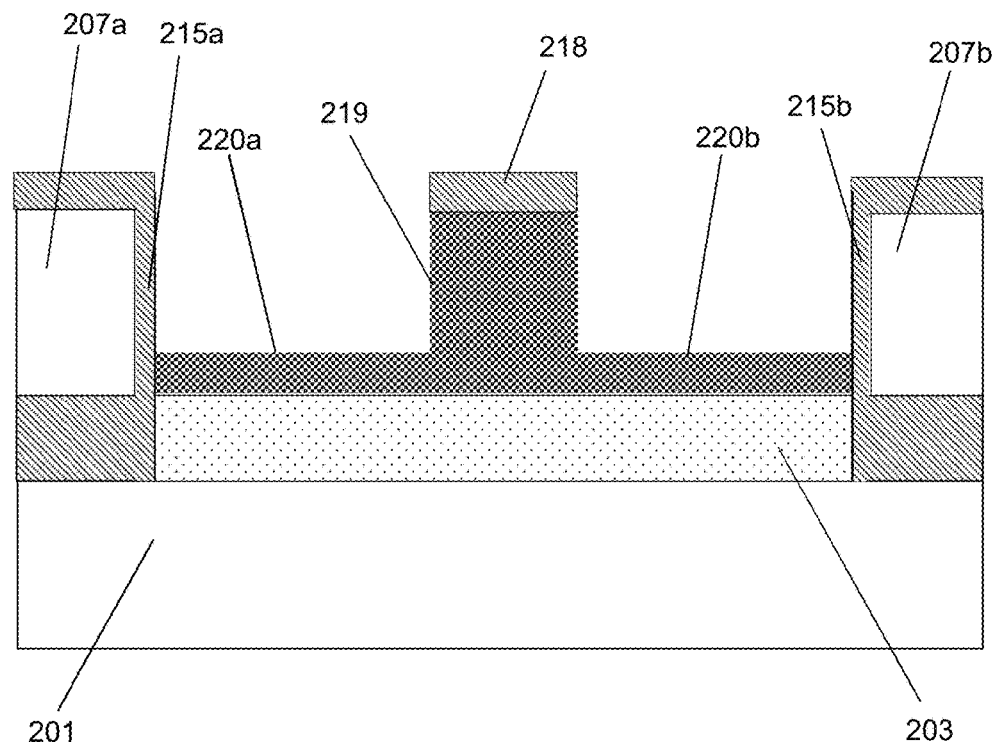
Figure 3I:
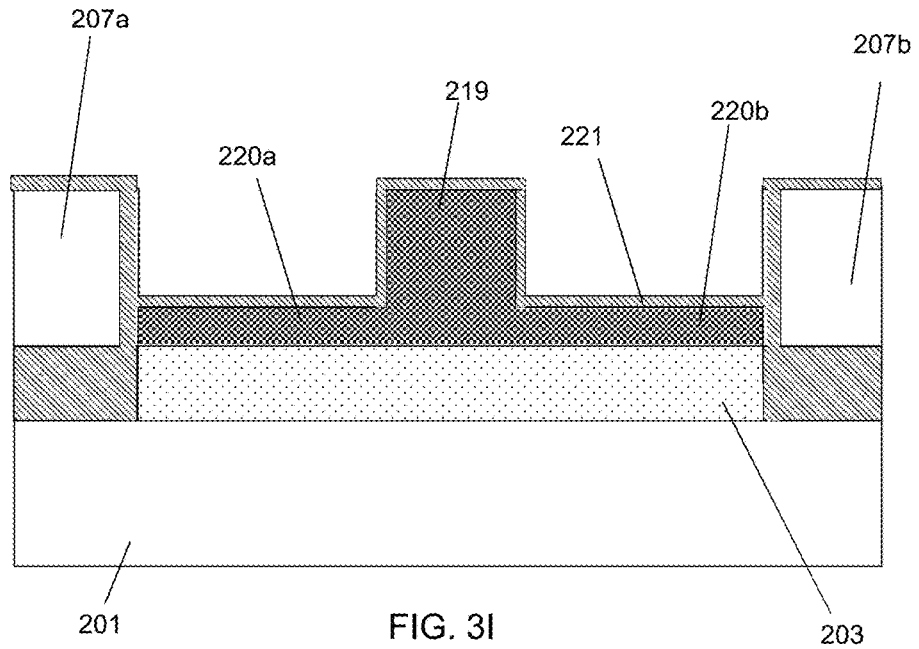
Figure 3J:
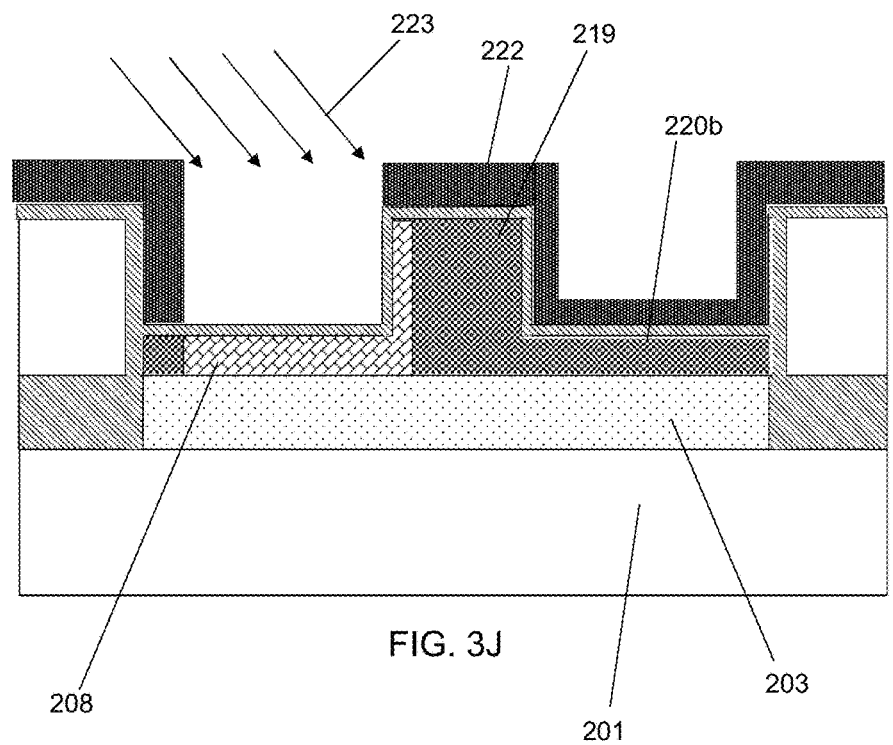
Figure 3K:
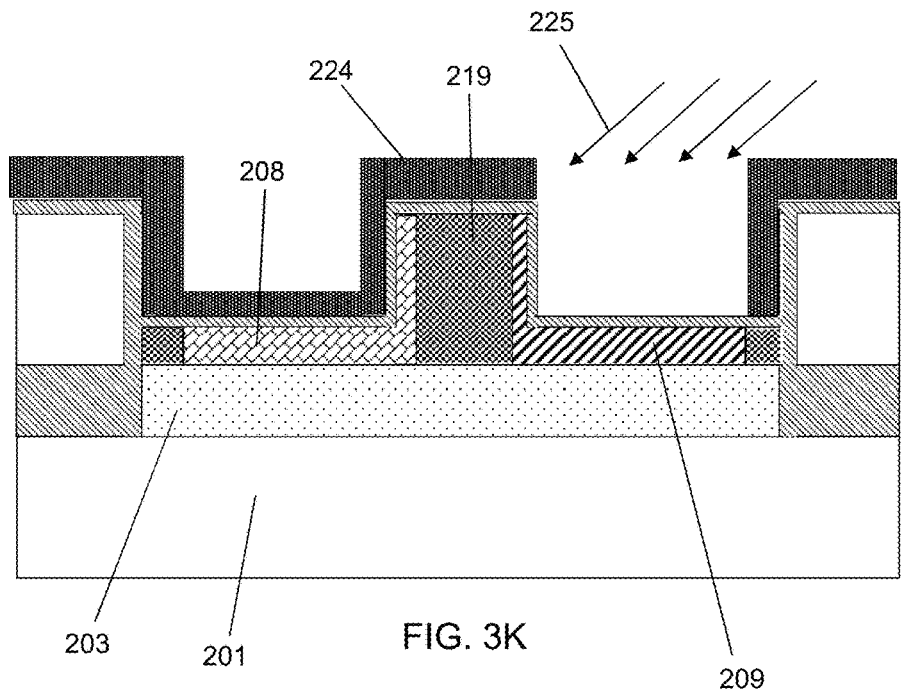
Figure 3L:
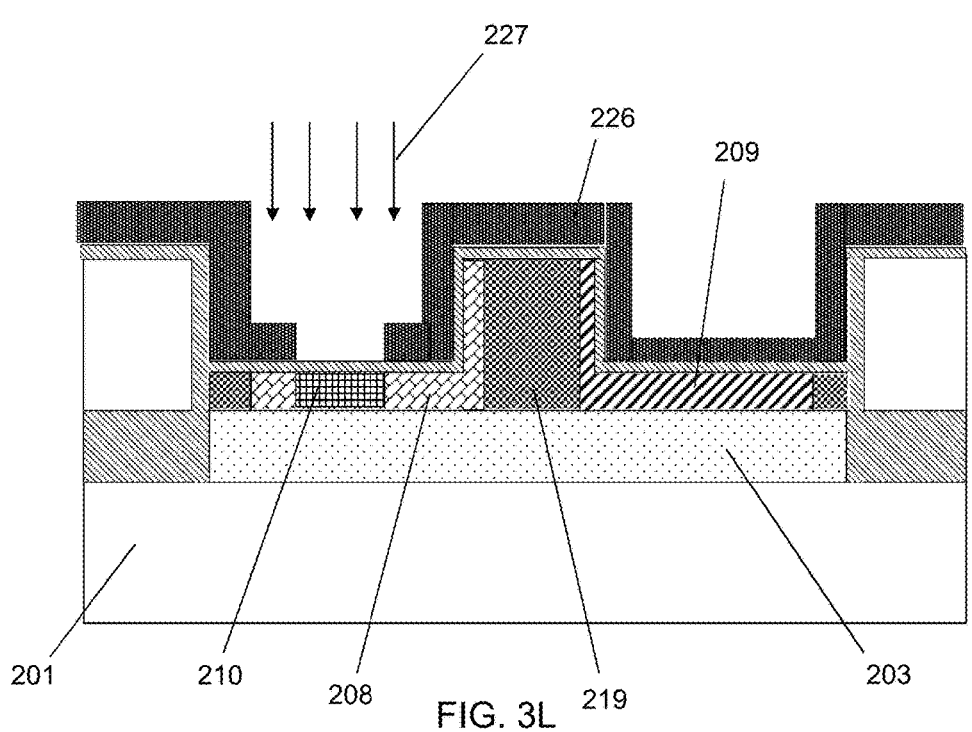
Figure 3M:
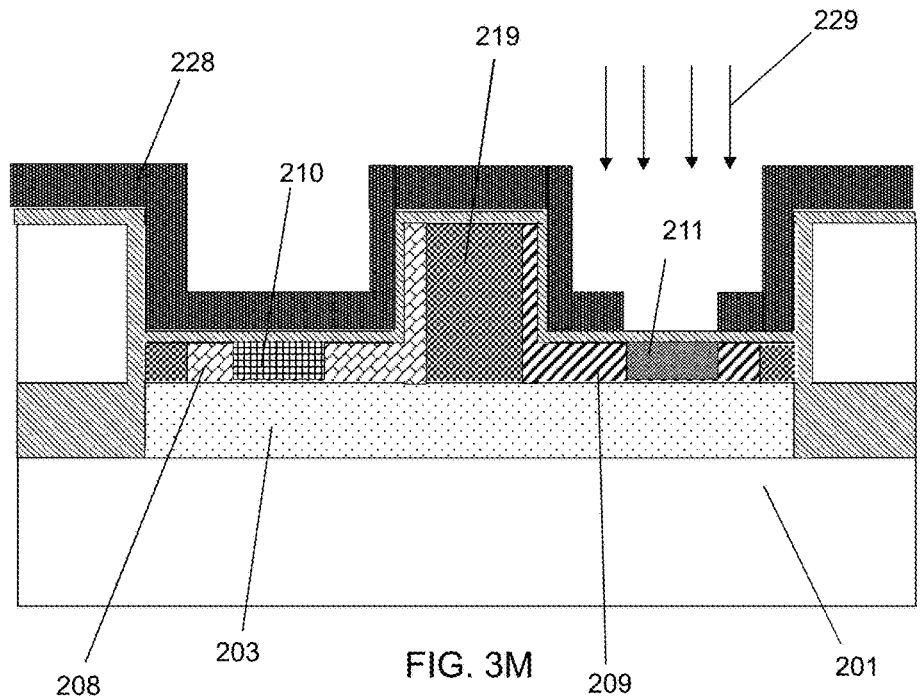
Figure 3N:
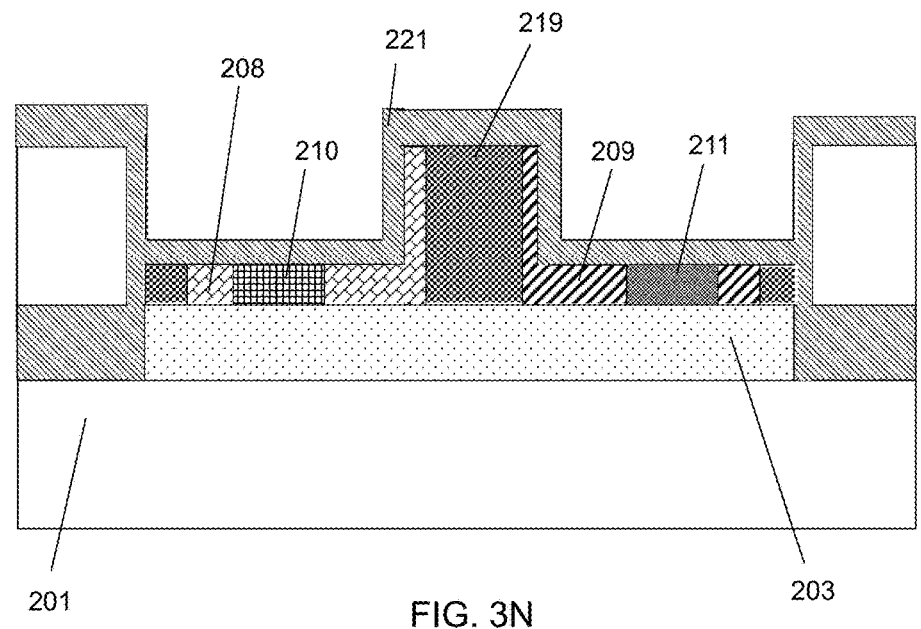
Figure 3O:
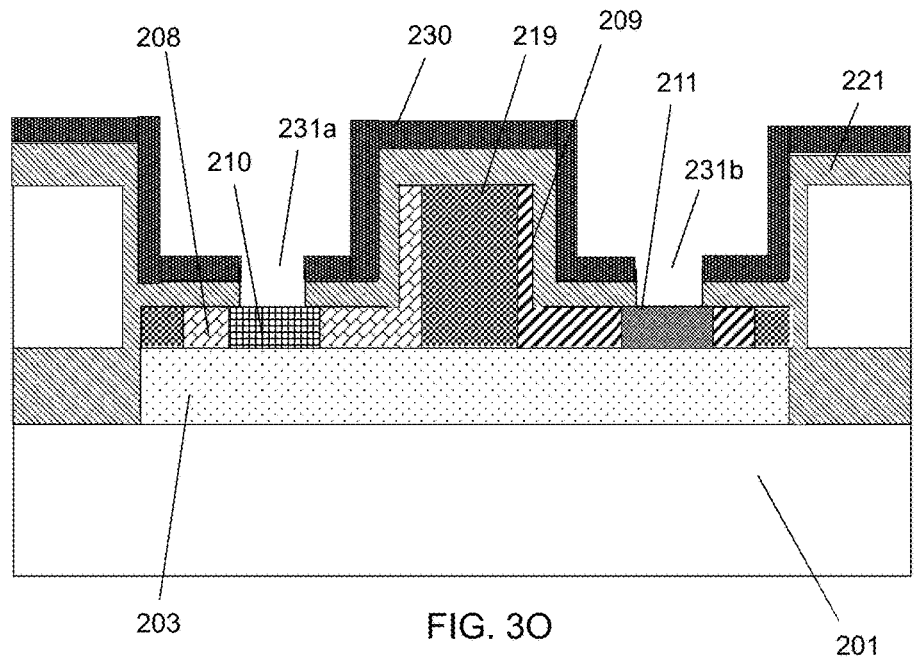
Figure 3P:
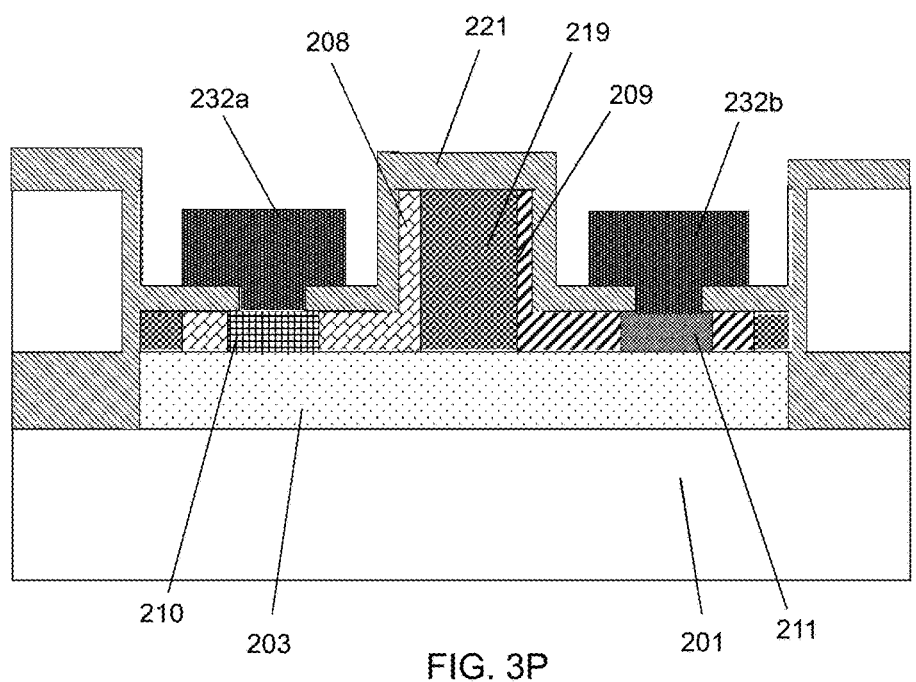

FIG. 3A-3P discuss manufacturing steps to provide a device as shown in FIGS. 2 and 3. In a first step, shown in FIG. 3A, a silicon-on-insulator wafer is provided. The wafer comprises a silicon substrate 201, a buried oxide layer 202 disposed thereon, and a silicon-on-insulator layer 207. Next, as illustrated in FIG. 3B, a first mask 212 is disposed over a region of the silicon-on-insulator layer and then the unmasked region is etched down to the buried oxide layer 202. This results in a cavity 213 in the silicon-on-insulator layer which is partially defined by sidewalls 207a and 207b. Next, the buried oxide layer in between the sidewalls 207 and 207b is etched away and the first mask is removed, resulting in a structure shown in FIG. 3C. The cavity is now at least partially defined by sidewalls of the silicon-on-insulator layer 207a and 207b as well as sidewalls 202a and 202b of the remaining buried oxide layer.

Next, as illustrated in FIG. 3D, an insulating liner 215a and 215b may be provided along the sidewalls 207a and 207b of the cavity 213. Indeed, in some embodiments there is no liner provided along the sidewalls of the cavity. The liner may extend along the top of the sidewalls 207a and 207b as illustrated. After the liner has been provided, a cladding layer 203 is grown onto the silicon substrate 201 as shown in FIG. 3E. The cladding layer may be an epitaxially grown silicon layer. The liner may ensure that the cladding layer grows with a generally homogenous crystal structure, as it may only grow from the silicon substrate and not from the sidewalls. As an optional extra step after regrowing the cladding layer, the insulating liner 215a and 215b, which may have been provided along the sidewalls 207a and 207b of the cavity 213, may be removed.

After the cladding layer has been provided, the optically active region 217 is grown as shown in FIG. 3F. Prior to this step, a seed layer may be grown on top of the cladding layer.

This can benefit the formation of the optically active region. The optically active region may be provided by the blanket deposition of germanium into the cavity 213. After deposition, the optically active region 217 is planarized by, for example, chemical-mechanical polishing such that an uppermost surface of the OAR is level with an uppermost surface of the liner 215a and 215b, as shown in FIG. 3G. If there is no liner, then the uppermost surface of the OAR would be level with the uppermost surface of the sidewalls 207a and 207b.

Next, as shown in FIG. 3H, a second mask 218 is provided over a portion of the OAR, and the unmasked region is etched to provide slabs 220a and 220b of the waveguide. The unetched region 219 provides a rib waveguide 219 as discussed above. This completes the key manufacturing steps for providing the optically active region.

As a further step, shown in FIG. 3I, a capping layer 221 is provided over the OAR. This capping layer is sufficiently thin that dopants can be implanted into regions of the OAR through the capping layer. For example, as shown in FIG. 3J, a third mask or photoresist 222 is provided a region of the device. The unmasked region is then exposed to dopants 223 of a first species, so as to dope a region 208 of the optically active region. In this example, the dopants are injected into a region of the slab 220a which is unmasked as well as a sidewall of the rib of the waveguide. The dopants may be, for example, boron and so the region is doped with a p type species of dopant. The third mask is then removed.

Similarly, as shown in FIG. 3K, a fourth mask or photoresist 224 is provided over a region of the device. The unmasked region is then exposed to dopants 225 of a second species, so as to dope a region 209 of the optically active region. In this example, dopants are injected into a region of the slab 220b which is unmasked as well as a sidewall of the rib waveguide. The dopants may be, for example, phosphorus and so the region is doped with an n type species of dopant. The fourth mask is then removed.

So as to decrease the electrical resistance of the first 208 and second 209 doped regions, further doping may be performed as will be discussed. In FIG. 3L, a fifth mask or photoresist 226 is disposed over a region of the device, and an unmasked region is exposed to further dopants 227 of the first species. This results in a first heavily doped region 210 within the first doped region 208. This region may be described as p++ doped relative to the p doped region 208. The fifth mask is then removed. Similarly, as shown in FIG. 3M, a sixth mask or photoresist 228 is provided over a region of the device, and an unmasked region is exposed to further dopants 229 of the second species. This results in a second heavily doped region 211 within the second doped region 209. This region may be described as n++ doped relative to the n doped region 209. The sixth mask is then removed.

As a further step shown in FIG. 3O, a seventh mask 230 may be provided over a region of the device, and the unmasked regions may be etched so as to remove portions of the capping layer 221 above the first 210 and second 211 heavily doped regions. This produces vias 231a and 231b. The seventh mask is then removed. In a final step, shown in FIG. 3P, electrodes 232a and 232b are provided which respectively contact the first 210 and second 211 heavily doped regions through the vias. An electric potential can be applied via electrodes 232a and 232b, resulting an electric field which passes horizontally across the waveguide 219. The device may therefore utilize the Franz-Keldysh effect to modulate the amplitude of light signals passing through.

Figure 4:
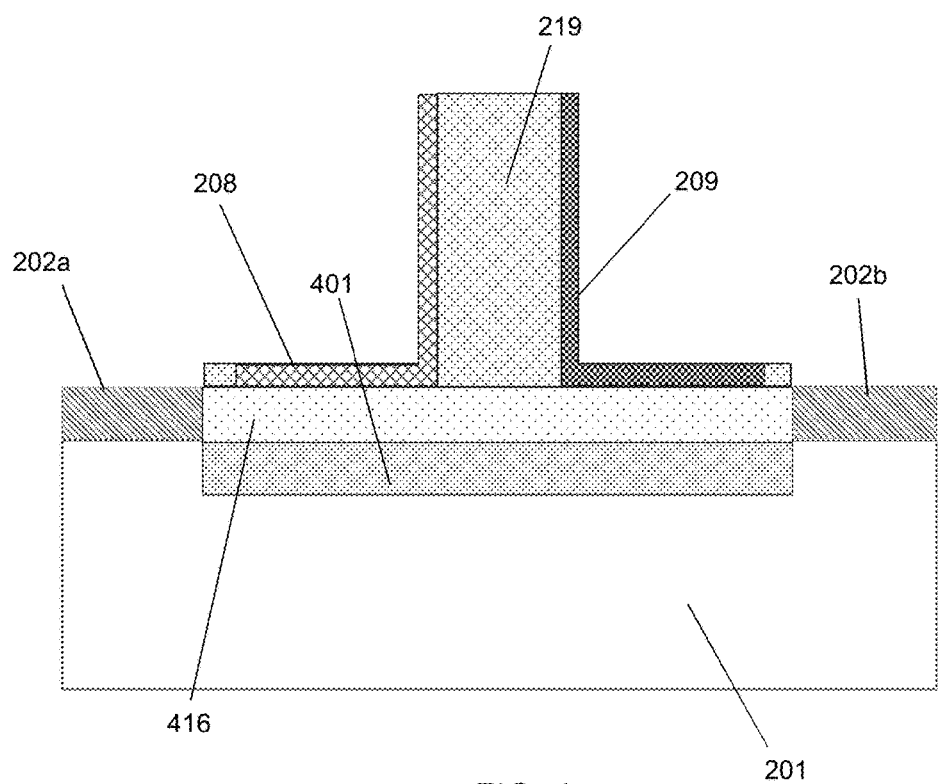
FIG. 4 shows a variant device.

A variant device is shown in FIG. 4, where a germanium seed layer 401 is disposed between the cladding layer 416 and the silicon substrate 201. Like features are indicated by like numerals. As will be appreciated, the additional features shown in FIG. 2B may also be present in this device, but for the sake of clarity are not shown.

Figure 5:
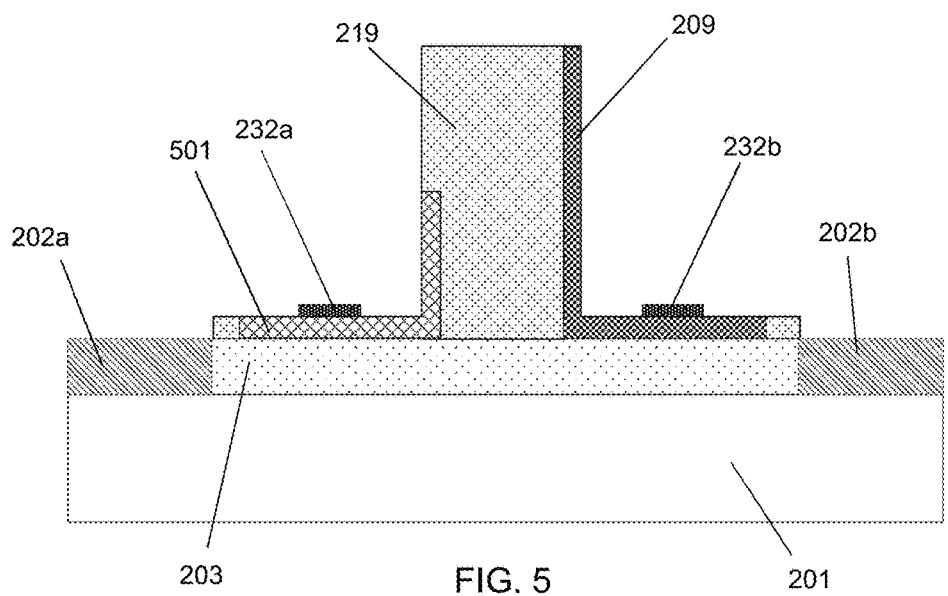
FIG. 5 shows a variant device.

Similarly, a further variant device is shown in FIG. 5. Here, the first doped region 501 extends only part of the way up the sidewall of the waveguide 219. As will be appreciated, the additional features shown in FIG. 2B may also be present in this device, but for the sake of clarity are not shown. This device is suitable for providing a bias across the junction to enable control of the phase of light traveling through the junction region via dispersion. The structure of the device and its method of manufacture are similar to that disclosed in WO 2016/0139484 titled "Waveguide Modulator Structures", the entire contents of which is incorporated herein by reference.

Figure 6:
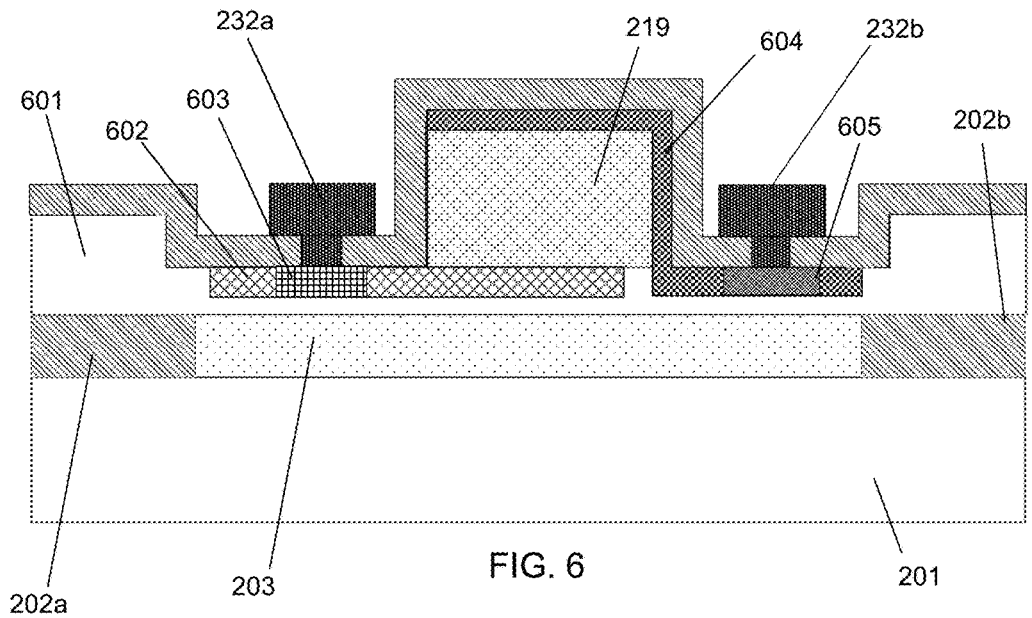
FIG. 6 shows a variant device.

Another variant device is shown in FIG. 6. Here, a further silicon layer 601 is doped to provide a first doped region 602 and a second doped region 604. Alternatively, the further silicon layer 601 is not used and the first doped region 602 is made in the cladding layer 203. They respectively include a first heavily doped region 603 and a second heavily doped region 605. In contrast to the previous devices, the first doped region 602 does not extend up a sidewall of the waveguide 219, but instead extends along a lowermost surface of the waveguide 219. Further, the second doped region 604 extends along an uppermost surface of the waveguide 219. Therefore, when a voltage is applied to electrodes 232a and 232b, a vertical electric field can therefore be provided across the waveguide 219 in contrast to the horizontal electric field in previous examples. The structure of the device and its method of manufacture are similar to that disclosed in WO 2017/081196 A1 titled "An optoelectronic component", the enter contents of which is incorporated herein by reference.

Figure 7:
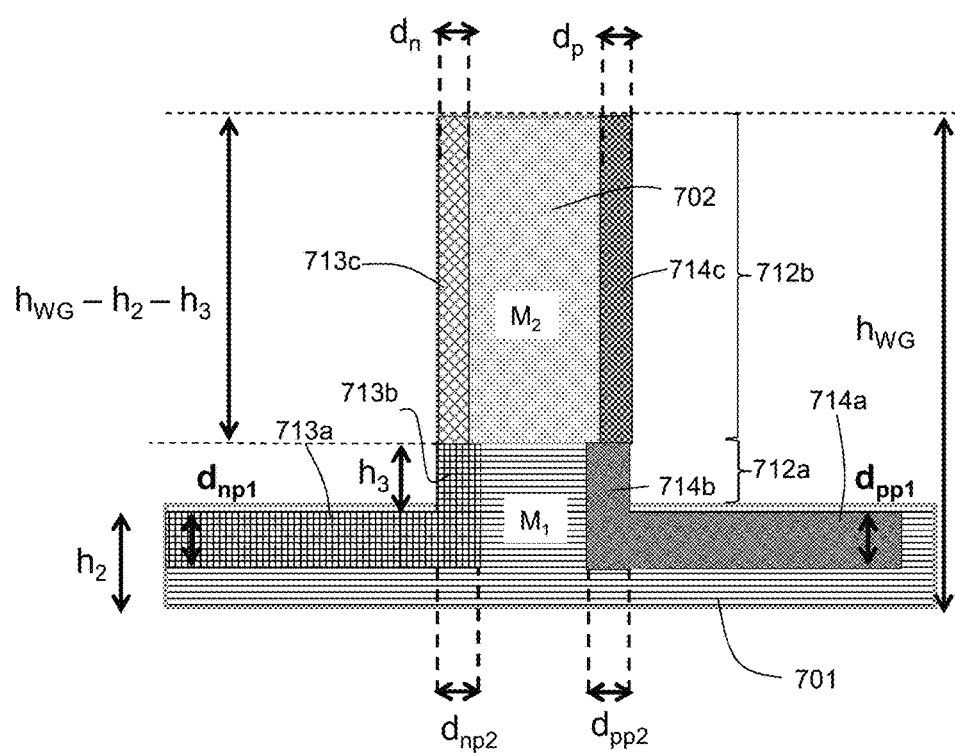
FIG. 7 shows a variant device.

A further variant device is shown in FIG. 7. In this Figure, a device is shown comprising a ridge modulation region with a height $h_{wg}$; the ridge modulation region being made up of a base 701 manufactured from a first waveguide material $M_1$ and a ridge 702 manufactured from a second waveguide material $M_2$ which is different from the first waveguide material.

The base 701 includes a first slab region extending away from a first sidewall of the waveguide ridge in a first direction, and a second slab region extending away from a second sidewall of the waveguide ridge in a second direction; the second direction being opposite the first direction.

The device includes a first doped region, the first doped region including a first doped slab region 713a and a first doped sidewall region extending along the first sidewall of the waveguide.

As shown in the Figure, the ridge of the waveguide is formed from a lower ridge portion 712a and an upper ridge portion 712b. The lower ridge portion is in contact with and extends away from the base; the base and lower ridge portion both being formed from the first material $M_1$. The upper ridge portion is made from the second material $M_2$ located on top of the lower ridge portion in that it is in contact with and extends away from the lower ridge portion.

The first doped sidewall region extends along the entire sidewall of the ridge including both the lower ridge portion 712a and the upper ridge portion 712b. The first doped sidewall region therefore comprises a first lower sidewall portion 713b which extends along the first sidewall at the lower ridge portion of the ridge; and a first upper sidewall portion 713c which extends along the sidewall at the upper ridge portion of the ridge.

Similarly, at the second side of the rib waveguide, the device comprises a second doped slab region 714a and a second doped sidewall region extending along the second sidewall of the waveguide. The second doped sidewall is made up of a second lower sidewall portion 714b which extends along the second sidewall at the lower ridge portion of the ridge; and a second upper sidewall portion 713c which extends along the sidewall at the upper ridge portion of the ridge.

The dopant concentration at the doped slab regions and the lower doped sidewall regions are higher than those of the upper doped sidewall regions. In the example shown, the first doped slab region and the first lower sidewall doped region are n++ doped, whilst the first upper sidewall is n doped; the n++ doped region typically contains at least one to two orders of magnitude more dopant per cm$^3$ as compared to the n doped region. The second doped slab region and second lower sidewall doped region are p++ doped whilst the first upper sidewall is p doped.

In the example shown, the first material $M_1$ is formed from silicon (Si) and the second material $M_2$ is formed of silicon/germanium (SiGe) or silicon germanium tin (SiGeSn). However, it is envisaged that the structure of this embodiment could equally be applied to other suitable optical materials. Examples of suitable dopant concentrations for an $M_1/M_2$ structure of Si/SiGe or Si/SiGeSn are shown in Table 1 below:

TABLE 1

| Doping type | Doping range [1/cm$^3$] |
|---|---|
| n | 1e15-1e18 |
| p | 1e15-1e18 |
| n++ | 1e18-1e20 |
| p++ | 1e18-1e20 |

As can be seen in FIG. 7, the first doped slab region can be defined by a thickness $d_{np1}$ by which it extends downwards into the slabs of the first material $M_1$. The first lower sidewall portion 713b and second lower sidewall portion 714b each extend upwardly away from the slab by a height $h_3$ which corresponds to the height of the lower portion of the ridge. These lower sidewall portions 713b, 714b extend into the ridge by respective distances $d_{np2}$, $d_{pp2}$, each of these respective distances being less than half the total cross-sectional width of the lower ridge portion, such that an undoped region separates the n++ region from the p++ region thereby forming a p-i-n junction.

An electrical contact (not shown) will be located at each of the slab regions in order to apply a bias across the junction which is formed by the doped regions. These electrical contacts will be located directly onto the slab (i.e. at the upper surface of the lab, on either side of the ridge). Typically the contacts may be equidistant from the respective sidewalls of the ridge.

The first and second upper sidewall portions 713c, 714c extend into the upper ridge portion of the ridge by a distance $d_n$, $d_p$ respectively, each of which is less than the respective distance $d_{np2}$, $d_{pp2}$, by which the lower sidewall portions 713b, 714b each extend into the lower portion of 712a of the rib waveguide. Examples of typical measurements are given (in nm) in Table 2:

TABLE 2

| Geometry | Tolerance |
|---|---|
| $h_1$ [nm] | 100-800 |
| $h_2$ [nm] | 100-400 |
| $h_3$ [nm] | 0-400 |
| $d_{np1}$, $d_{np2}$ [nm] | 50-300 |
| $d_{pp1}$, $d_{pp2}$ [nm] | 50-300 |
| $d_p$ [nm] | 50-300 |
| $d_n$ [nm] | 50-300 |

In this example, the waveguide device takes the form of a waveguide electro-absorption modulator (EAM). However, it is possible that the device could instead take the form of another optoelectronic component such as a waveguide photodiode (PD).

The structure of the device and its method of manufacture are similar to that disclosed in U.S. 62/429,701, the entire contents of which is incorporated herein by reference.

Figure 8:
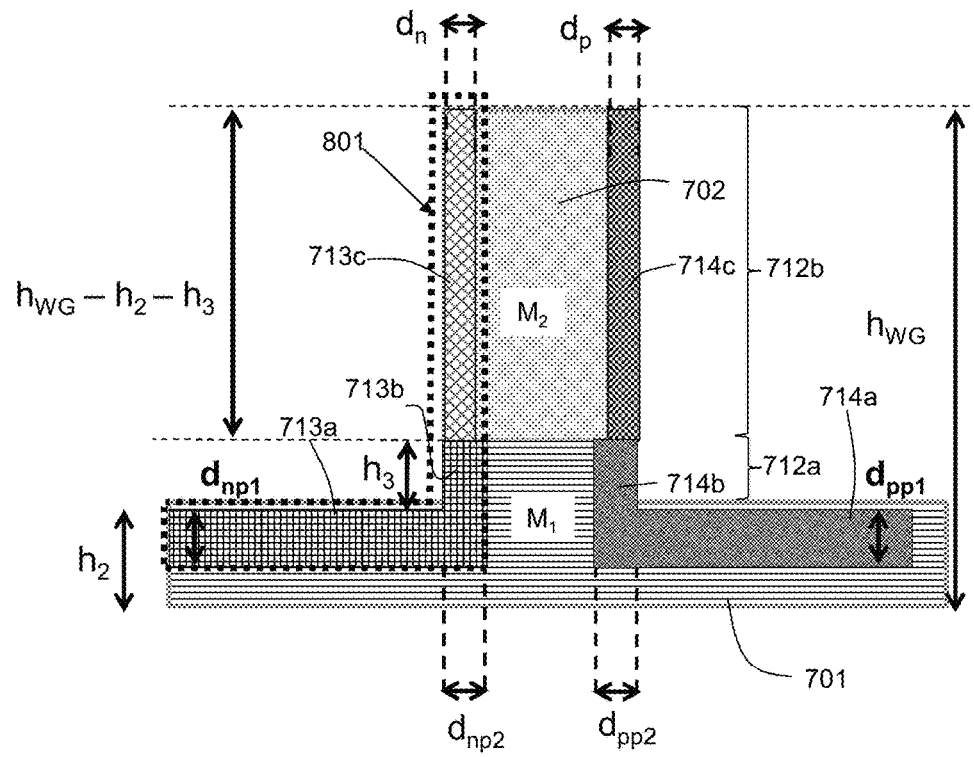
FIGS. 8-14 show variant structures for the optically active region and/or device.

FIG. 8 shows an optically active region which is similar to that shown in FIG. 7. However, the region indicated within dotted line 801 which includes the first doped slab portion 713a, the first lower sidewall portion 713b, and the first upper sidewall portion 713c is formed of crystalline or amorphous silicon. Whilst not shown, it is possible that there is a buried oxide layer beneath the base 701 but this is optional.

Figure 9:
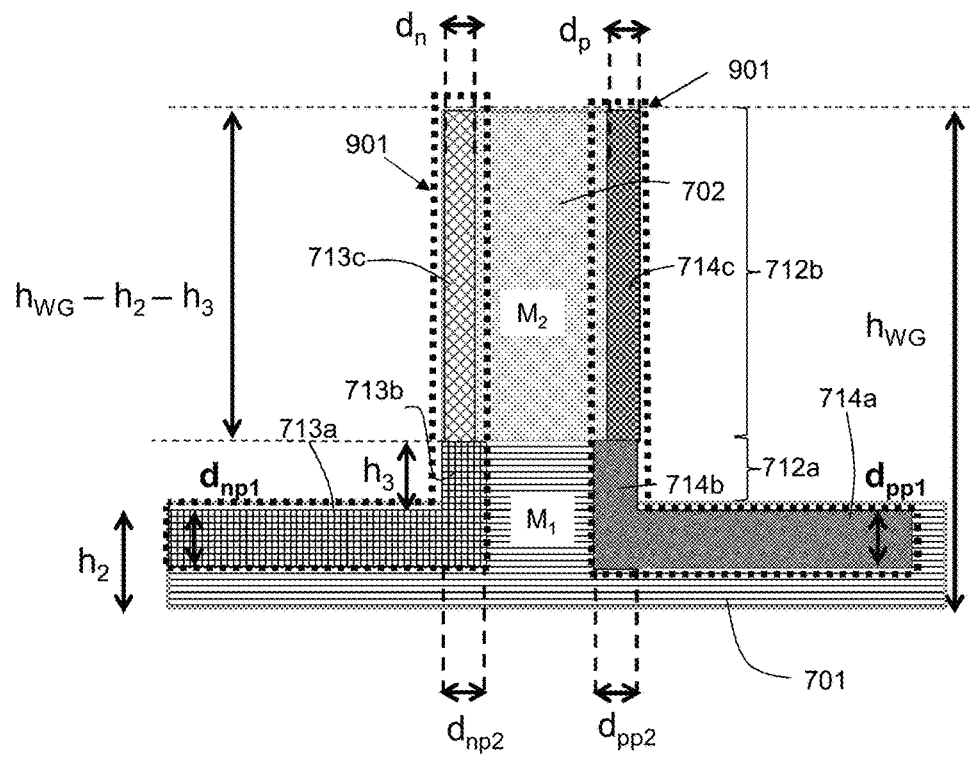

FIG. 9 is similar to FIG. 8, except that the region indicated within dotted line 901 now includes the second doped slab portion 714a, the second lower sidewall portion 714b, and the second upper sidewall portion 714c and so these regions are also formed of crystalline or amorphous silicon. Whilst not shown, it is possible that there is a buried oxide layer beneath the base 701 but this is optional.

Figure 10:
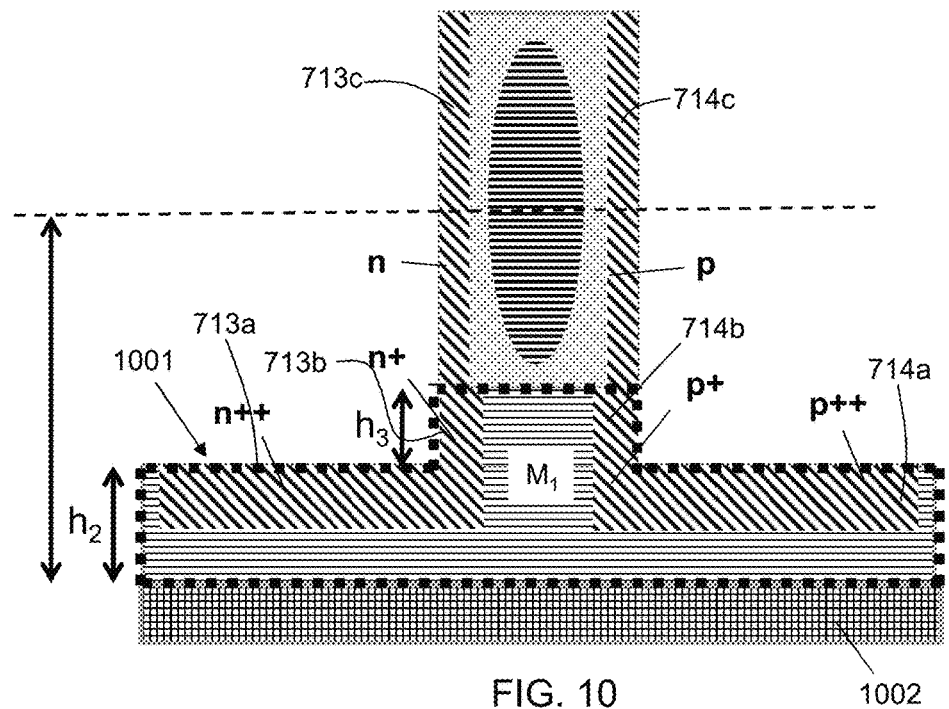

FIG. 10 shows a variant optically active region to those previously. Here, the entire slab, as well as a portion of the ridge 713b 714b, is within the region indicated within dotted line 1001. This region is formed of crystalline or amorphous silicon. This device is shown with an optionally buried oxide layer 1002 below the region 1001. This is also true of the devices shown in FIGS. 7, 8, 9, 11, and 12.

Figure 11:
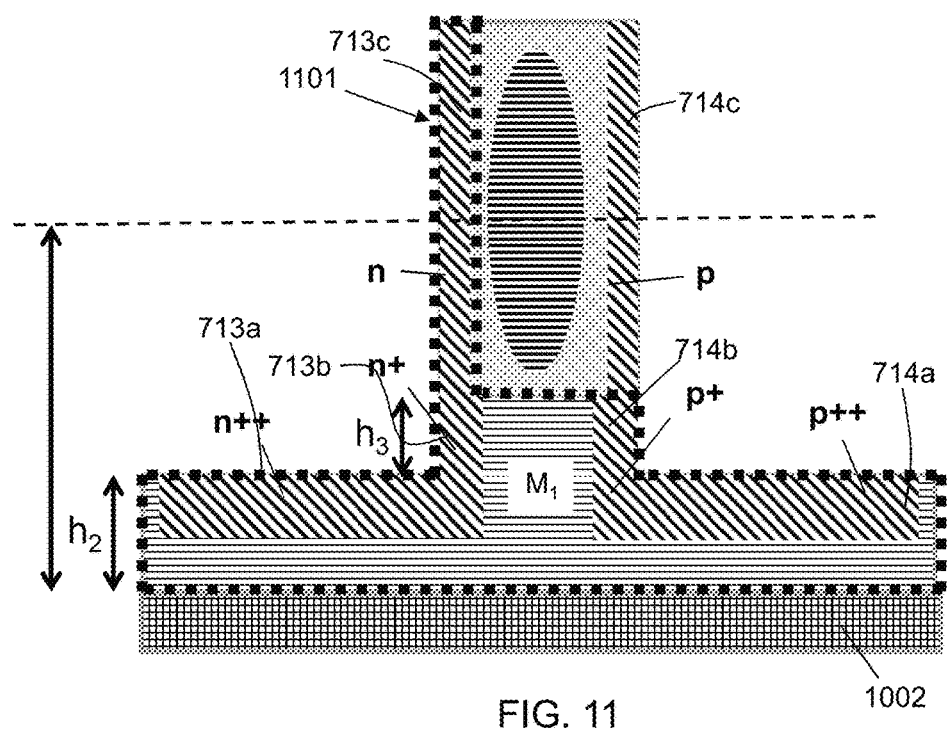
Figure 12:
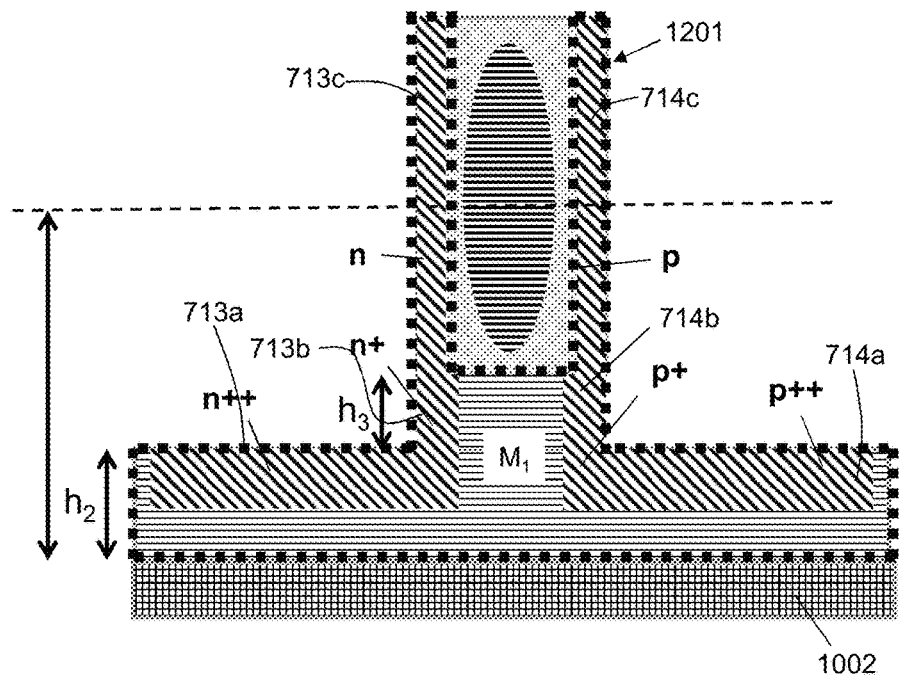

FIG. 11 shows an optically active region which is similar to that shown in FIG. 10. However here the dotted region 1101 extends up one side of the rib waveguide and so includes the first upper sidewall portion 713c and so this is also formed of crystalline or amorphous silicon. FIG. 12 is an extension of this, where the second upper sidewall portion 714c is also included and so this is also formed of crystalline or amorphous silicon.

Figure 13:
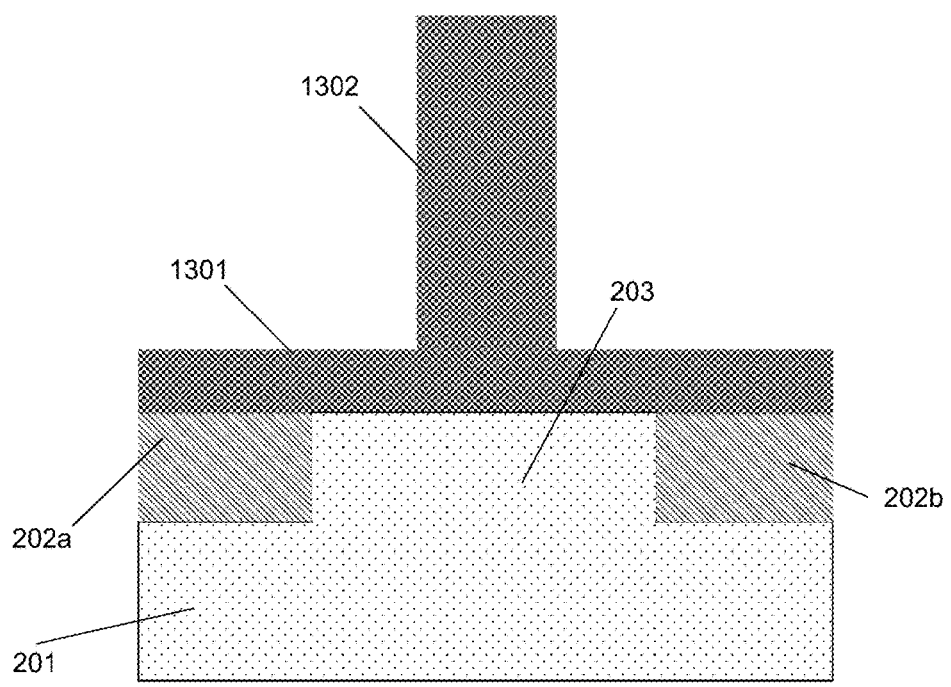

FIG. 13 shows a further alternative example of the optoelectronic device. Here, as with previous embodiments, a slab 1301 and rib 1302 form a ridge waveguide disposed above a silicon substrate 201. However, in contrast to previous examples, the cladding layer 203 is not as wide as the slab 1301. Instead, first and second portions of a buried oxide layer 202a and 202b are disposed underneath the slab 1301.

Figure 14:
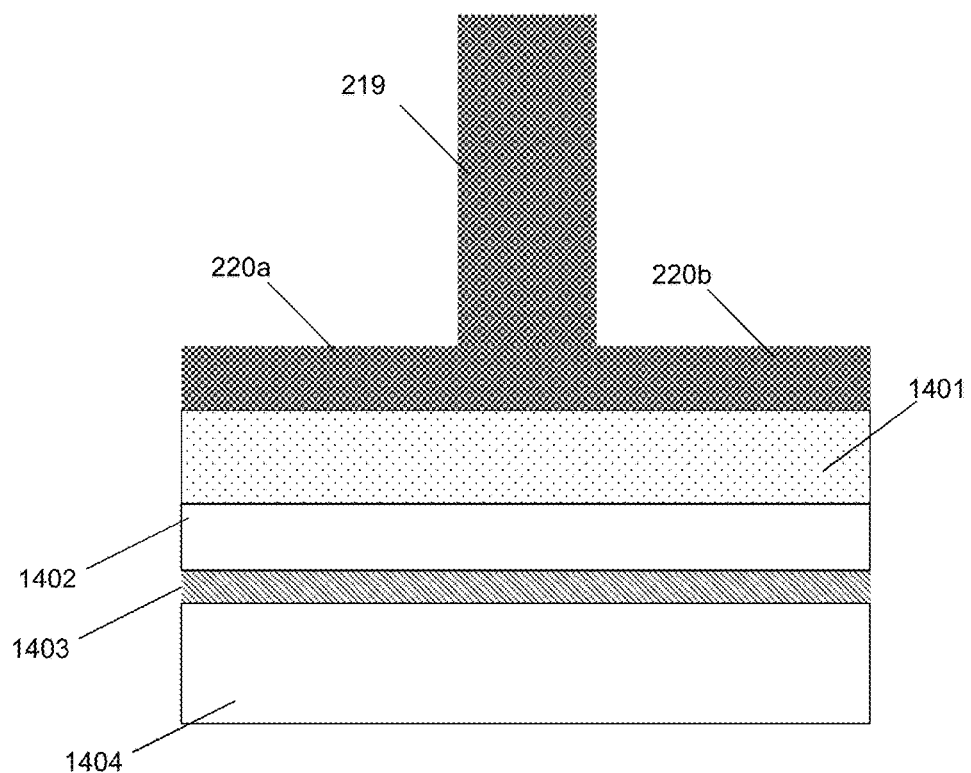

FIG. 14 shows a further alternative example of the optoelectronic device. Generally, this example is similar to any previous example discussed (and so may have, where appropriate, any of the features disclosed with reference thereto). A difference however, shown in FIG. 14, is that this device is provided on a double silicon-on-insulator wafer. Therefore the cladding layer 1401, which confines an optical mode of the device to the optically active region 219, is above a substrate 1402 (which is generally formed of silicon). That substrate 1402 is above a buried oxide layer 1403, for example SiO$_2$, which is in turn above a second substrate 1404. The manufacturing steps described above apply equally here, where etching is performed at least to a buried oxide layer no longer shown in FIG. 14 but which would have been above substrate 1402.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

LIST OF FEATURES

100 Chip
101 Input waveguide
102,107 Light guiding direction
103 Input waveguide/OAR interface
104 Optoelectronic device
105, 205 OAR
106 Output waveguide
108 OAR/Output waveguide interface
201 Silicon substrate
202$a$, 202$b$ Buried oxide
203, 416 Cladding layer
206 Capping layer
207$a$, 207$b$ Silicon-on-insulator layer
208 First doped region
209 Second doped region
210 First heavily doped region
211 Second heavily doped region
212 First mask
213 Cavity
214 Upper surface of substrate
215$a$, 215$b$ Insulating liner
217 Grown optically active region
218 Second mask
219 Ridge of rib waveguide
220$a$, 220$b$ Slabs of rib waveguide
221 Capping layer
222 Third mask
223 First dopant implantation
224 Fourth mask
225 Second dopant implantation
226 Fifth mask
227 Third dopant implantation
228 Sixth mask
229 Fourth dopant implantation
230 Seventh mask
231$a$, 231$b$ Via opening
232$a$, 232$b$ Electrodes
401 Seed layer

The invention claimed is:

1. An optoelectronic device, comprising:
 a substrate;
 a regrown cladding layer, on the substrate;
 an insulating layer;
 an optically active region, above the regrown cladding layer;
 a first waveguide; and
 a second waveguide,
 wherein:
 the regrown cladding layer has a refractive index which is less than a refractive index of the optically active region, such that an optical mode of the optoelectronic device is confined to the optically active region,
 the insulating layer is directly on the substrate, over a first region of the substrate,
 the regrown cladding layer is on the substrate, over a second region of the substrate, different from the first region of the substrate,
 the first waveguide is on the insulating layer,
 the second waveguide is in the optically active region,
 the substrate is a silicon substrate,
 the insulating layer is an oxide layer,
 the first waveguide is over the first region of the substrate and extends to a boundary between the first region of the substrate and the second region of the substrate,
 the second waveguide is over the second region of the substrate and extends to the boundary between the first region of the substrate and the second region of the substrate,
 the first waveguide is configured to support a first optical mode, and
 the second waveguide is configured to support a second optical mode, coupled to the first optical mode.

2. The optoelectronic device of claim 1, wherein the optically active region is an electro-absorption modulator or a photodiode.

3. The optoelectronic device of either claim 1, wherein the optically active region is formed of Si$_x$Ge$_{1-x-y}$Sn$_y$ where 5%≤x≤20%, 1%≤y≤10%.

4. The optoelectronic device of claim 1, wherein the cladding layer is formed of silicon or SiGe and is epitaxially grown silicon or SiGe.

5. The optoelectronic device of claim 1, further comprising a silicon seed layer between the cladding layer and the optically active region.

6. The optoelectronic device of claim 1, wherein the optically active region comprises a silicon-germanium region.

7. The optoelectronic device of claim 1, wherein a length of the optically active region is between 30 μm and 60 μm.

8. The optoelectronic device of claim 1, further comprising:
 an insulating layer, disposed on a first and/or second horizontal side of the cladding layer, wherein the cladding layer has a height from the substrate substantially equal to or greater than that of the insulating layer.

9. The optoelectronic device of claim 1, wherein the optically active region is disposed within a cavity of a silicon-on-insulator layer which is disposed above the substrate.

10. The optoelectronic device of claim 1, further comprising:
 an input waveguide, coupled to a first side of the optically active region; and
 an output waveguide, coupled to a second side of the optically active region;
 wherein the interface between the input waveguide and the optically active region and the interface between the output waveguide and the optically active region are at an angle greater than 0° relative to a guiding direction of the input waveguide and/or output waveguide.

11. The optoelectronic device of claim 1, wherein the optically active region includes a waveguide ridge, and has:
 an upper surface and a lower surface;

a lower doped region, located at and/or adjacent to at least a portion of the lower surface of the optically active region, and extends laterally outwards from the waveguide ridge in a first direction;

an upper doped region, located at and/or adjacent to at least a portion of the upper surface of the waveguide ridge of the optically active region, and extends laterally outwards from the waveguide ridge in a second direction; and an intrinsic region located between the lower doped region and the upper doped region.

12. The optoelectronic device of claim 1, wherein the optically active region includes a rib waveguide modulation region, the rib waveguide modulation region having:
   a ridge extending from the cladding layer;
   a first slab region at a first side of the ridge and a second slab region at a second side of the ridge; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

13. The optoelectronic device of claim 1, wherein the optically active region includes a rib waveguide modulation region, the rib waveguide modulation region having:
   a ridge extending from the cladding layer, at least a portion of the ridge being formed from a chosen semiconductor material which is different from the material of the cladding layer;
   wherein the cladding layer includes a first slab region at a first side of the ridge and a second slab region at a second side of the ridge; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

14. The optoelectronic device of claim 1, wherein the optically active region includes a rib waveguide modulation region, the rib waveguide modulation region having:
   a ridge extending from the cladding layer, at least a portion of the ridge being formed from a chosen semiconductor material which is different from the material of the cladding layer;
   a first slab region at a first side of the ridge and a second slab region at a second side of the ridge; and either the first slab region or the second slab region is the material of the cladding layer; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

15. The optoelectronic device of claim 1, wherein the optically active region includes a rib waveguide modulation region, the rib waveguide modulation region having:
   a silicon base, disposed on top of the cladding layer;
   a ridge extending from the silicon base, at least a portion of the ridge being formed from a chosen semiconductor material which is different from the material of the silicon base;
   wherein the silicon base includes a first slab region at a first side of the ridge, and a second slab region at a second side of the ridge; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

16. The optoelectronic device of claim 1, wherein the optically active region includes:
   a waveguide ridge; and
   a waveguide slab;
   wherein at least one of: a sidewall of the ridge; a portion of the slab; the entirety of the slab; a portion of the ridge adjacent to the slab; and both sidewalls of the ridge; are formed of crystalline or amorphous silicon and contain dopants.

17. The optoelectronic device of claim 16, wherein the remainder of the waveguide ridge and waveguide slab is formed of SiGe, germanium, or SiGeSn.

18. The optoelectronic device of claim 1, wherein the optically active region is formed of SiGe or SiGeSn having a first composition and the cladding layer is formed of SiGe or SiGeSn having a second composition different to the first composition.

19. The optoelectronic device of claim 1, wherein the device is driveable at a voltage of between 1.8 V and 2 V.

20. An optoelectronic device, formed on a silicon-on-insulator wafer comprising a substrate, an insulating layer, and a silicon-on-insulator layer, comprising:
   a cladding layer, formed of a different material to the material of the insulating layer, on the substrate;
   an optically active region, above the cladding layer;
   a first waveguide; and
   a second waveguide,
   wherein:
      the cladding layer has a refractive index which is less than a refractive index of the optically active region such that an optical mode of the optoelectronic device is highly confined inside the optically active region,
      the insulating layer does not extend below the optically active region,
      the insulating layer is directly on the substrate, over a first region of the substrate,
      the cladding layer is on the substrate, over a second region of the substrate, different from the first region of the substrate,
      the first waveguide is on the insulating layer,
      the second waveguide is in the optically active region,
      the substrate is a silicon substrate,
      the insulating layer is an oxide layer,
      the first waveguide is over the first region of the substrate and extends to a boundary between the first region of the substrate and the second region of the substrate,
      the second waveguide is over the second region of the substrate and extends to the boundary between the first region of the substrate and the second region of the substrate,
      the first waveguide is configured to support a first optical mode, and
      the second waveguide is configured to support a second optical mode, coupled to the first optical mode.

21. The optoelectronic device of claim 20, wherein the optically active region is an electro-absorption modulator or a photodiode.

22. The optoelectronic device of claim 20, wherein the cladding layer is formed of silicon or SiGe.

23. The optoelectronic device of claim 21, wherein the optically active region is formed of $Si_xGe_{1-x-y}Sn_y$ where 5%≤x≤20% and 1%≤y≤10%.

24. The optoelectronic device of claim 20, wherein the cladding layer is formed of silicon or SiGe and is epitaxially grown silicon.

25. The optoelectronic device of claim 20, further comprising a germanium seed layer or SiGe layer, functional as a seed layer, between the cladding layer and the optically active region.

26. The optoelectronic device of claim 20, wherein the optically active region comprises a silicon-germanium region.

27. The optoelectronic device of claim 20, wherein a length of the optically active region is between 30 μm and 60 μm.

28. The optoelectronic device of claim 20, further comprising:
   an insulating layer, disposed on a first and/or second horizontal side of the cladding layer, wherein the cladding layer has a height from the substrate substantially equal to or greater than that of the insulating layer.

29. The optoelectronic device of claim 20, wherein the optically active region is disposed within a cavity of a silicon-on-insulator layer.

30. The optoelectronic device of claim 20, further comprising:
   an input waveguide, coupled to a first side of the optically active region; and
   an output waveguide, coupled to a second side of the optically active region;
   wherein the interface between the input waveguide and the optically active region and the interface between the output waveguide and the optically active region are at an angle greater than 0° relative to a guiding direction of the input waveguide or output waveguide.

31. The optoelectronic device of claim 20, wherein the optically active region includes a waveguide ridge, and has:
   an upper surface and a lower surface;
   a lower doped region, located at and/or adjacent to at least a portion of the lower surface of the optically active region, and extends laterally outwards from the waveguide ridge in a first direction;
   an upper doped region, located at and/or adjacent to at least a portion of the upper surface of the waveguide ridge of the optically active region, and extends laterally outwards from the waveguide ridge in a second direction; and
   an intrinsic region located between the lower doped region and the upper doped region.

32. The optoelectronic device of claim 20, wherein the optically active region includes a rib waveguide modulation region, the rib waveguide modulation region having:
   a ridge extending from the cladding layer;
   a first slab region at a first side of the ridge and a second slab region at a second side of the ridge; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

33. The optoelectronic device of claim 20, wherein the optically active region includes a rib waveguide modulation region, the rib waveguide modulation region having:
   a ridge extending from the cladding layer, at least a portion of the ridge being formed from a material which is different from the material of the cladding layer;
   wherein the cladding layer includes a first slab region at a first side of the ridge and a second slab region at a second side of the ridge; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

34. The optoelectronic device of claim 20, wherein the optically active region includes a rib waveguide modulation region, the rib waveguide modulation region having:
   a ridge extending from the cladding layer, at least a portion of the ridge being formed from a chosen semiconductor material which is different from the material of the cladding layer;
   a first slab region at a first side of the ridge and a second slab region at a second side of the ridge; and either the first slab region or the second slab region is the material of the cladding layer; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

35. The optoelectronic device of claim 20, wherein the optically active region includes a rib waveguide modulation region, the rib waveguide modulation region having:
   a silicon base, disposed on top of the cladding layer;
   a ridge extending from the silicon base, at least a portion of the ridge being formed from a material which is different from the material of the cladding layer;
   wherein the silicon base includes a first slab region at a first side of the ridge, and a second slab region at a second side of the ridge; and
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region.

36. The optoelectronic device of claim 20, wherein the optically active region includes:
   a waveguide ridge; and
   a waveguide slab;
   wherein at least one of: a sidewall of the ridge; a portion of the slab; the entirety of the slab; a portion of the ridge adjacent to the slab; both sidewalls of the ridge; are formed of crystalline or amorphous silicon and contain dopants.

37. The optoelectronic device of claim 36, wherein the remainder of the waveguide ridge and waveguide slab is formed of SiGeSn, SiGe, or germanium.

38. The optoelectronic device of claim 20, wherein the optically active region is formed of SiGe or SiGeSn having a first composition and the cladding layer is formed of SiGe or SiGeSn having a second composition different to the first composition.

39. The optoelectronic device of claim 20, wherein the device is driveable at a voltage of between 1.8 V and 2 V.

* * * * *

UNITED STATES PATENT AND TRADEMARK OFFICE
CERTIFICATE OF CORRECTION

| | |
|---|---|
| PATENT NO. | : 10,133,094 B1 |
| APPLICATION NO. | : 15/700053 |
| DATED | : November 20, 2018 |
| INVENTOR(S) | : Guomin Yu et al. |

It is certified that error appears in the above-identified patent and that said Letters Patent is hereby corrected as shown below:

On the Title Page

| | |
|---|---|
| Page 4, in Column 1, item (56), References cited, Other Publication, Line 15 | delete "p-i-n." and insert -- p-i-n -- |
| Page 4, in Column 1, item (56), References cited, Other Publication, Line 17 | delete "p-i-n." and insert -- p-i-n -- |

In the Claims

| | |
|---|---|
| Column 16, Line 29, Claim 3 | after "of" delete "either" |

Signed and Sealed this
Fourth Day of July, 2023

Katherine Kelly Vidal
*Director of the United States Patent and Trademark Office*